United States Patent
Moriceau et al.

(10) Patent No.: US 7,781,300 B2
(45) Date of Patent: Aug. 24, 2010

(54) METHOD FOR PRODUCING MIXED STACKED STRUCTURES, DIFFERENT INSULATING AREAS AND/OR LOCALISED VERTICAL ELECTRICAL CONDUCTING AREAS

(75) Inventors: Hubert Moriceau, Saint Egreve (FR); Franck Fournel, Moirans (FR); Christophe Morales, Vizille (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/576,743

(22) PCT Filed: Oct. 6, 2005

(86) PCT No.: PCT/IB2005/054432

§ 371 (c)(1),
(2), (4) Date: Apr. 6, 2007

(87) PCT Pub. No.: WO2006/072871

PCT Pub. Date: Jul. 13, 2006

(65) Prior Publication Data

US 2007/0202660 A1    Aug. 30, 2007

(30) Foreign Application Priority Data

Oct. 6, 2004    (FR)    .................... 04 52284

(51) Int. Cl.
H01L 21/76    (2006.01)
(52) U.S. Cl. ................ 438/405; 438/459; 257/E21.564
(58) Field of Classification Search ................ 438/407, 438/405, 459; 257/E21.282, E21.487, E21.564
See application file for complete search history.

(56) References Cited

U.S. PATENT DOCUMENTS

| | | | |
|---|---|---|---|
| 4,653,858 A | 3/1987 | Szydlo et al. | |
| 4,710,794 A | 12/1987 | Koshino et al. | |
| 4,956,314 A | 9/1990 | Tam et al. | |
| 5,238,865 A | 8/1993 | Eguchi | |
| 5,466,630 A | 11/1995 | Lur | |
| 5,733,813 A * | 3/1998 | Chen et al. | ................. 438/440 |
| 5,972,758 A | 10/1999 | Liang | |
| 6,060,344 A | 5/2000 | Matsui et al. | |

(Continued)

FOREIGN PATENT DOCUMENTS

EP    0 736 897 A2    10/1996

(Continued)

OTHER PUBLICATIONS

J. Steigerwald, et al., "CMP of Other Materials and New CMP Applications", *Chemical Mechanical Planarization of Microelectronic Materials*, Chapter 8, pp. 269-277, John Wiley & Sons, New York, 1997.
Q. Y. Tong, et al., "Semiconductor Wafer Bonding, Science and Technology", The Electrochemical Society Series, 1999, 159 Pages.
A. J. Auberton-Hervé, et al., "Why Can Smart Cut® Change the Future of Microelectronics?", International Journal of High Speed Electronics and Systems, vol. 10, No. 1, 2000, pp. 131-146.

(Continued)

*Primary Examiner*—W. David Coleman
(74) *Attorney, Agent, or Firm*—Oblon, Spivak, McClelland, Maier & Neustadt, L.L.P.

(57) ABSTRACT

The invention relates to a method for producing a semiconducting structure including:
controlled formation, through a mask (31), in a first substrate (30) in a semiconducting material, of at least one first area in an insulating material (36), up to the level of the lower surface (35) of the mask, before or during the removal of the mask.

74 Claims, 14 Drawing Sheets

U.S. PATENT DOCUMENTS

Figure 1A:
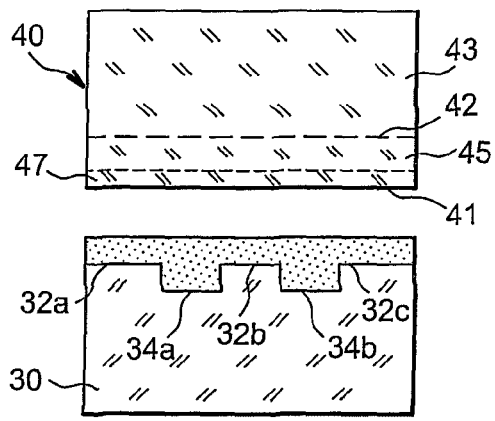

| | | |
|---|---|---|
| 6,171,923 B1 | 1/2001 | Chi et al. |
| 6,191,007 B1 | 2/2001 | Matsui et al. |
| 6,235,607 B1 * | 5/2001 | Ibok ........................ 438/407 |
| 6,245,636 B1 * | 6/2001 | Maszara .................... 438/411 |
| 6,372,657 B1 | 4/2002 | Hineman et al. |
| 6,417,078 B1 * | 7/2002 | Dolan et al. ............... 438/480 |
| 6,531,375 B1 * | 3/2003 | Giewont et al. ............ 438/407 |
| 6,727,186 B1 | 4/2004 | Skotnicki et al. |
| 6,955,971 B2 | 10/2005 | Ghyselen et al. |
| 6,987,051 B2 | 1/2006 | Schwarzenbach et al. |
| 7,348,253 B2 * | 3/2008 | Bedell et al. ............... 438/407 |
| 7,494,897 B2 | 2/2009 | Fournel et al. |
| 7,498,245 B2 | 3/2009 | Aspar et al. |
| 2002/0079551 A1 | 6/2002 | Hokazono |
| 2003/0077885 A1 | 4/2003 | Aspar et al. |
| 2003/0096506 A1 | 5/2003 | Li et al. |
| 2004/0065931 A1 | 4/2004 | Benzel et al. |
| 2004/0081805 A1 | 4/2004 | Furihata et al. |
| 2004/0127061 A1 | 7/2004 | Yu |
| 2004/0150067 A1 | 8/2004 | Ghyselen et al. |
| 2004/0180519 A1 | 9/2004 | Schwarzenbach et al. |
| 2004/0241934 A1 | 12/2004 | Inoue |
| 2006/0166461 A1 | 7/2006 | Fournel et al. |
| 2007/0200144 A1 | 8/2007 | Aspar et al. |
| 2007/0202660 A1 | 8/2007 | Moriceau et al. |
| 2008/0036039 A1 | 2/2008 | Aspar |

FOREIGN PATENT DOCUMENTS

| | | |
|---|---|---|
| EP | 1 398 829 | 3/2004 |
| FR | 2 847 077 | 5/2004 |
| FR | 2 850 487 | 7/2004 |
| FR | 2 876 220 | 4/2006 |
| WO | WO 01/93325 | 12/2001 |
| WO | WO 2004/019362 | 3/2004 |
| WO | WO 2004/044975 A1 | 5/2004 |
| WO | WO 2004/059711 | 7/2004 |
| WO | WO 2004/059725 | 7/2004 |

OTHER PUBLICATIONS

C. H. Yun, et al., "SOI on Buried Cavity Patterns Using Ion-Cut Layer Transfer," Proceedings 1998 IEEE International SOI Conference, Oct. 1998, pp. 165-166.

* cited by examiner

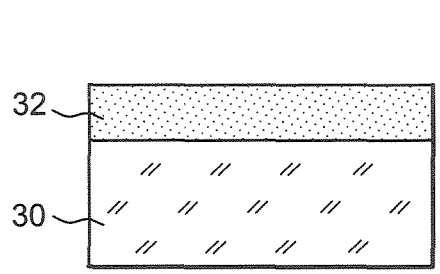
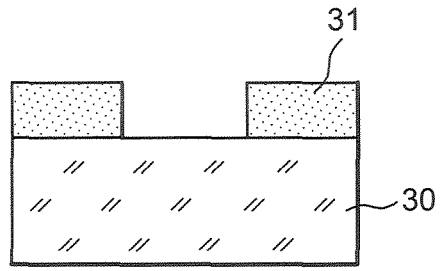
FIG. 7A                FIG. 7B
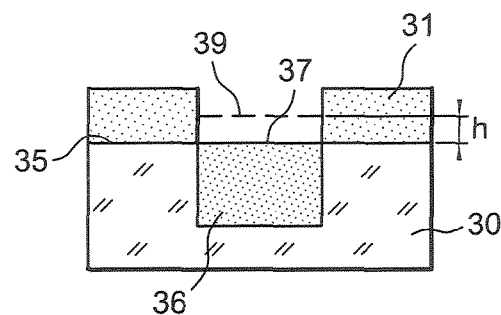
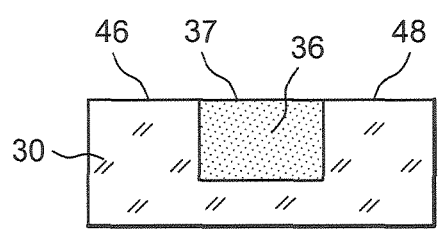
FIG. 7C                FIG. 7D
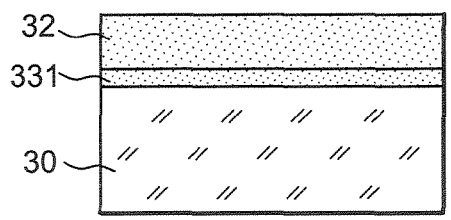
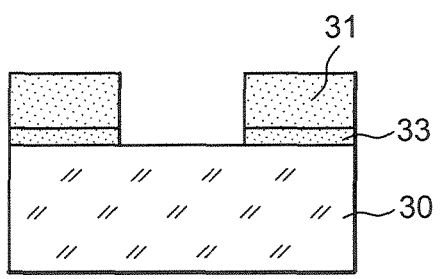
FIG. 8A                FIG. 8B

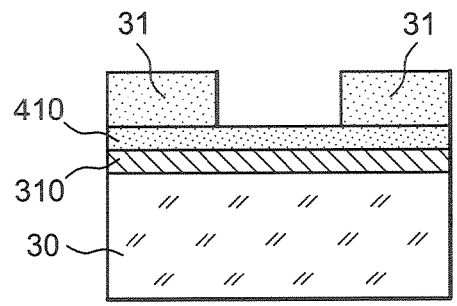
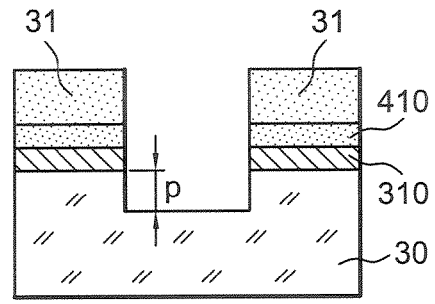
FIG. 11A    FIG. 11B
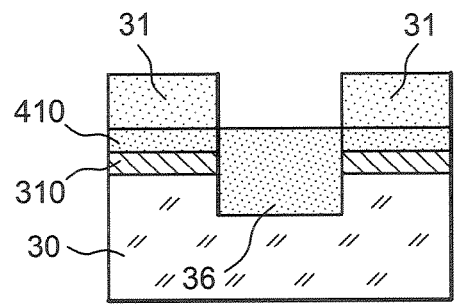
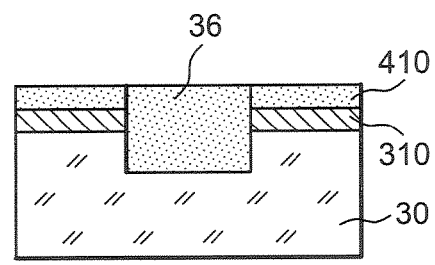
FIG. 11C    FIG. 11D
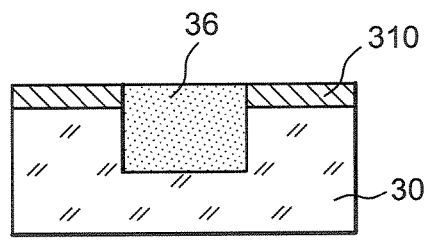
FIG. 11E

US 7,781,300 B2

METHOD FOR PRODUCING MIXED STACKED STRUCTURES, DIFFERENT INSULATING AREAS AND/OR LOCALISED VERTICAL ELECTRICAL CONDUCTING AREAS

TECHNICAL FIELD AND PRIOR ART

The invention relates to the field of semiconductor-on-insulator type structures, such as for silicon-on-insulator also designated as SOI, structures.

In these technologies, a substrate of material, generally a semiconducting material, supports a buried insulator film, for example in silicon dioxide, and a film of superficial semiconducting material.

Producing such semiconductor-on-insulator structures is possible by means of several technologies, such as for example described in the book of Q. Y. Tong and U. Gösele, <<Semiconductor wafer bonding, Science and technology>>, Ed. The Electrochemical Society Series, 1999:
- by means of methods based on implanting oxygen in a semiconducting material and on heat treatment(s) at high temperatures (methods of the SIMOX type),
- by means of methods based on molecular bonding and with, for example, i.e.:
  - mechanical and/or chemical thinning (methods of the BSOI type),
  - mechanical thinning and chemical etching with etch-stop on a sacrificial layer (methods of the BESOI type),
  - making porous embrittlement area(s), prior to molecular bonding, with a view to subsequent separation,
  - implanting gas species in a semiconductor wafer prior to molecular bonding, in order to generate an embrittled area therein with a view to subsequent fracture.

The invention mainly relates to the field of methods based on molecular bonding and structures made by such methods.

Figure 1B:
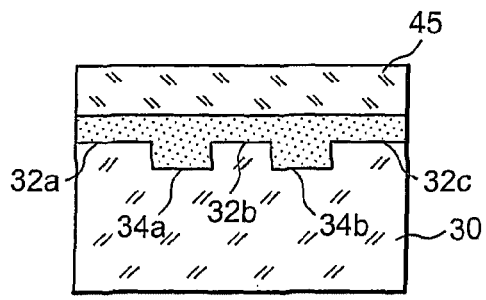
Figure 2A:
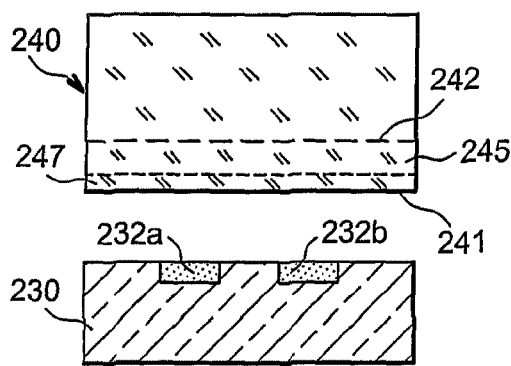
Figure 2B:
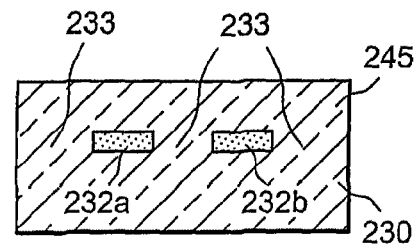

Various needs are expressed:

1) The possibility of having on a same semiconducting structure 230, as illustrated in FIG. 2B, areas 233 with vertical conduction (analogous in its behavior to a bulk, epitaxied semiconductor, etc. . . . ), which separate vertically electrically insulated areas 232a, 232b, of the substrate, 2) the possibility of locally having, as illustrated in FIG. 1B, SOIs 30 with very fine buried oxide areas 32a, 32b, 32c and SOIs with thicker buried oxide areas 34a, 34b.

3) the possibility of locally having vertical conduction areas, SOI areas with fine buried oxides and SOI areas with thicker buried oxides and variable thicknesses.

4) the possibility of having SOIs with more than two thicknesses of buried oxide.

Document FR-2847077 discloses the possibility of making surface-structured silicon wafers, so that areas for example including thick oxides 34a, 34b (FIG. 1A) alternate with fine oxide areas 32a, 32b, 32c, or else oxide areas 232a, 232b alternate with areas 233 without any oxide, i.e., in virgin silicon (FIG. 2A).

According to an exemplary method described in document FR-2 847 077, insulating areas or layers (the example of silicon oxide $SiO_2$ will be assumed) 32a, 32b, 32c, 34a, 34b with different thicknesses are produced in a first semiconducting substrate 30 (the example of silicon will be assumed). Different techniques may be applied for producing these insulating areas. They will be described further on, in connection with FIG. 3A and the following figures.

Such structured wafers may then be bonded by molecular bonding on virgin silicon wafers 40 or on oxidized silicon wafers, the oxide layer of which 47 has a small thickness.

More specifically, in the second semiconducting substrate 40, an atomic or ionic implantation is achieved which forms a thin layer 42 which extends substantially parallel to a surface 41 of the substrate 40. In fact, a layer or an embrittlement or fracture plane is thereby formed which delimits, in the volume of the substrate 40, a lower region 45 intended to form a thin film and an upper region 43 forming the bulk of the substrate 40. This implantation generally is a implantation of hydrogen, but it may also be performed by means of other species, or even with H/He co-implantation.

Both of the thereby prepared substrates 30 and 40 are then assembled by a technique of the "wafer bonding" type or by contact of the adherent type, for example by molecular adhesion or by bonding. As regards these techniques, reference may be made to the book of Q. Y. Tong and U. Gosele <<Semiconductor Wafer Bonding>> (Science and Technology), Wiley Interscience Publications.

A portion of the substrate 40 is then detached by a treatment with which a fracture along the embrittlement plane 42 may be produced. An example of this technique is described in the article of A. J. Auberton-Hervé et al. <<Why can Smart-Cut change the future of microelectronics?>> published in the International Journal of High Speed Electronics and Systems, Vol. 10, No. 1 (2000), p. 131-146.

A semiconducting component or element or a semiconducting structure according to FIG. 1B is thereby formed.

According to still another embodiment illustrated in FIGS. 2A and 2B, a first substrate is a bulk semiconducting (for example: silicon) substrate 230 in which insulating areas (for example: $SiO_2$) 232a, 232b are produced beside areas of bulk silicon.

In a second substrate 240, an embrittlement layer 242 similar to the layer 42 described above, is generated by atomic or ionic implantation, for example with hydrogen ions. This embrittlement layer delimits, in the volume of the substrate 240, the thin layer 245.

Both thereby prepared substrates 230 and 240 are then assembled by one of the techniques already mentioned above ("wafer bonding" or bonding or contacting of the adherent type, for example by molecular adhesion).

The portion of the substrate 240, located on the side opposite to the face 241 for assembling the substrates, is then eliminated or detached, as already described above in connection with FIG. 1B.

A semiconducting component or element or a mixed planar semiconducting structure is thereby formed according to the structure of FIG. 2B, having an alternation (or any other form of juxtaposition or distribution) of insulating areas 232a, 232b (here: $SiO_2$), which may have thicknesses different from each other and semiconductor or crude silicon areas.

Various electronic components may then be produced in the surface layers 45, 245 of semiconductor or silicon, notably in the portion of the layer located above the insulator or silicon oxide areas.

Producing structures such as the substrate 30 of FIG. 1A and the substrate 230 of FIG. 2A, according to the teaching of document FR 2 847 077, notably involves the following steps, illustrated in FIG. 3A-3E or 4A-4C.

Figure 3A:
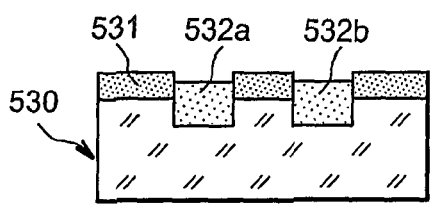

In FIG. 3A, silicon dioxide areas 532a, 532b are produced on a substrate 530 by growth with the LOCOS ("Local Oxidation of Silicon") method through a mask 531. These areas may have the shape of pads or strips or more complex shapes.

The mask is then removed (FIG. 3B), leaving silicon oxide areas 532a, 532b.

A planarization step by chemical-mechanical polishing (FIG. 3C) is then performed, which leads to a substrate having silicon dioxide areas 534a, 534b, juxtaposed to the silicon of the actual substrate. This substrate is for example the one used in FIG. 2A.

Figure 3B:
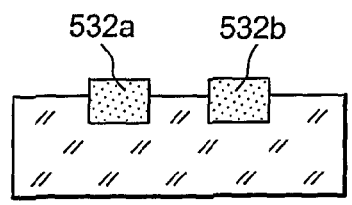

According to one alternative (FIG. 3D), a surface oxidation layer 533 of the substrate is produced from the structure of FIG. 3B and then (FIG. 3E) the assembly is planarized by chemical-mechanical polishing, in order to leave a surface oxidation layer 535.

A layer of a few hundreds of nanometers (for example 300 nm) may thereby be removed, leaving juxtaposition of silicon dioxide areas with different thicknesses. This type of substrate is used in FIG. 1A above.

Figure 4A:
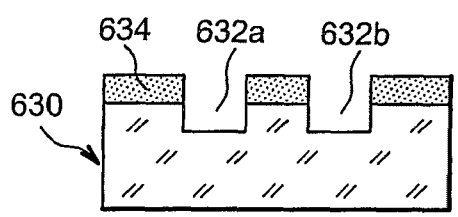
Figure 4B:
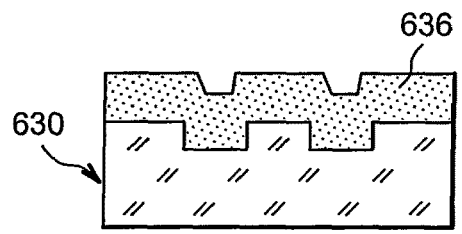
Figure 4C:
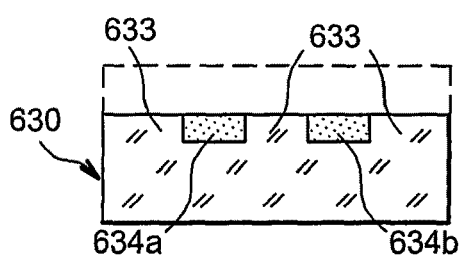

Another method which may be applied is illustrated in FIGS. 4A-4c.

In FIG. 4A, trenches 632a, 632b are etched, for example by dry etching, through a mask 634, in a silicon substrate 630.

The mask is then removed (FIG. 4B), and then the substrate is thermally oxidized at the surface, or else a silicon dioxide layer is deposited, forming a silicon dioxide layer 636.

A planarization step by chemical-mechanical polishing (FIG. 4C) is then performed, which leads to a substrate having silicon dioxide areas 634a, 634b juxtaposed to the silicon 633 of the actual substrate. This substrate for example is the one used in FIG. 2B.

Figure 4D:
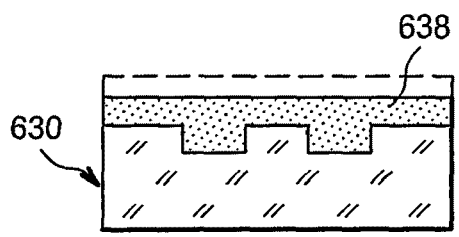

According to one alternative (FIG. 4D), the assembly of FIG. 4B is flattened, but less than in the case of FIG. 4C, leaving a silicon dioxide layer 638. Juxtaposition of silicon dioxide areas of different thicknesses at the surface of the silicon substrate 630 is thereby achieved. This type of substrate is used in FIG. 1A above.

To summarize, these techniques apply:
- a first lithographic step for producing a mask (for example in nitride) with a view to localized oxidation of the wafer,
- a second step for oxidizing open areas on the mask (FIG. 3A) and also if need be, the other areas (FIG. 4B), by an oxidizing thermal treatment,
- a third step for reducing the surface topology by a chemical-mechanical polishing technique. This step is stopped according to the structure to be produced, according to whether one seeks to obtain at the surface of the silicon wafer, an alternation of areas with fine oxide and of areas with thicker oxide, or an alternation of virgin silicon and silicon oxide.

Whichever the one of these methods which is applied, it requires thinning by chemical-mechanical polishing, which proves to be a critical step.

Figure 5A:
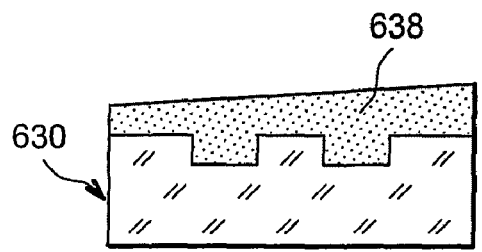

As illustrated in FIG. 5A, this step may induce a lack of thickness homogeneity in different points of the wafer, this lack of homogeneity in particular is proportional to the removed thickness.

Figure 3C:
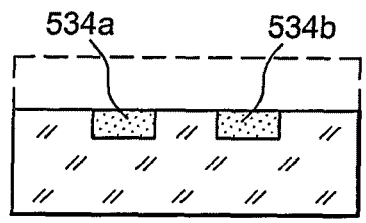
Figure 3D:
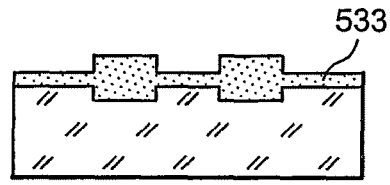
Figure 3E:
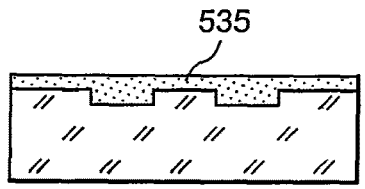

This problem is encountered as soon as a substrate such as the one of FIG. 3B or 3D or the one of FIG. 4B is subject to chemical-mechanical polishing.

It is therefore difficult with this thinning polishing technique, to find operating conditions with which areas with fine oxide may be obtained, the thickness of which is homogenous over the whole silicon wafer or even simply in various points of the silicon wafer.

Further, this chemical-mechanical polishing step is also critical when it is carried out at the same time on two different materials, for example silicon and silicon oxide as in the case of the substrate of FIG. 3B or FIG. 4B so as to end up with the structure of FIG. 3C or 4C respectively.

Figure 5B:
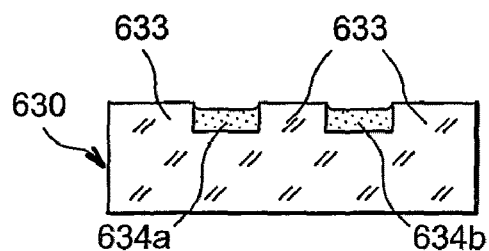

Indeed, as illustrated in FIG. 5B, it is then delicate to avoid differential polishing (dishing) between the areas 633 having a semiconductor at the surface and the areas 634a, 634b having an oxide at the surface: the level of these different areas is not uniform. In FIG. 5B, the oxide areas are <<recessed>> relatively to the semiconductor material areas. In the case when the semiconductor is silicon and silicon oxide $SiO_2$, <<recesses>> will on the contrary be obtained at the silicon because chemical-mechanical polishing is more effective on Si than on $SiO_2$.

In both cases, there results a surface which may pose problems with regard to possible molecular bonding.

The problem discussed above in the case of a silicon/silicon oxide $SiO_2$ system are also posed with other semiconducting materials and other insulating materials.

There is therefore the problem of producing such semiconducting material wafers having a structured surface, therefore either having variable thicknesses of insulator as in FIG. 1A, or alternations of insulating material and semiconducting material, as in FIG. 2A, and compatible with bonding by subsequent molecular adhesion.

It is notably sought that the homogeneity in thickness of the insulating films in the fine insulating areas should be correct.

It is also sought that a minimum of topology should be present at the surface (and therefore a minimum dishing or difference of levels between the insulator areas and the semiconductor areas, as explained above), in particular when there is an alternation, at the surface, of virgin semiconductor and insulator.

The problem is posed of producing such structures without resorting to a long step of chemical-mechanical polishing which poses the problems discussed above in connection with FIGS. 5A and 5B.

DISCUSSION OF THE INVENTION

The invention first relates to a method for producing a semiconductor structure including the controlled formation of at least one first area in an insulating material, in a first substrate in semiconducting material, through a mask, up to the level of the lower surface of the mask, before or during removal of the mask.

This method does not apply any thinning step by chemical-mechanical polishing and in particular after the removal of the mask, and with it the desired structures may therefore be obtained without encountering the problems of planarity as explained above.

Surface cleaning is sufficient in order to then remove contaminants of the hydrocarbon type or particles.

The formation of the insulator may include a step for controlled growth of an insulating material, up to the level of the lower surface of the mask, and then removal of the mask.

According to one alternative, the formation of the insulator may include a step for controlled growth of an insulating material, up to above the level of the lower surface of the mask.

It is then possible to bring the upper surface of the insulator back to the level of the lower surface of the mask.

According to one alternative, the upper surface of the insulator is brought back to an intermediate level above the lower surface of the mask, so as to maintain a residual insulator layer above this surface.

This residual layer may at least be partly removed during removal of the mask and/or at least partly removed during removal of a surface layer covering the mask.

Removal of the residual layer or thinning of the insulator may be achieved by chemical etching.

The substrate may further include an insulating layer at the surface, which may, if need be, removed after growth or formation of the insulating area in order to form an alternation of conducting areas and/or semiconducting areas and/or insulating areas.

This insulating layer may have a thickness between 1 nm and 50 μm for example.

The substrate may further include at the surface, a conducting layer, for example in silicide or in metal, possibly covered with a protective layer which is not removed after removal of the mask.

The first substrate may be etched beforehand in the area in which at least one portion of the insulator is formed, thereby forming an etched area in the semiconducting material.

The etched area in the semiconducting material may have a depth between 1 nm and 10 μm for example.

According to the possible layers deposited on the substrate, the etching may also be etching of a surface insulating layer and/or a conducting layer, and possibly of a protective layer for this conducting layer.

Removal of the mask is preferably achieved selectively with respect to the insulating material.

If this removal is not selective, overgrowth of the insulating material above the level of the lower surface of the mask may occur, as already explained above, an overgrowth which is then compensated by a thinning step, as already explained above, during removal of the mask or by a step for removing a surface layer covering the mask.

The invention also relates to a method for producing a semiconducting component, including:

the formation or controlled growth of an insulator, through the mask, in a first area of a semiconducting substrate, and up to above the level of the lower surface of a mask covering at least a second area of the substrate or covering an insulating layer or a conducting layer or a layer for protecting such a conducting layer covering at least one second area of the substrate, the etching of the insulator, selectively with respect to the mask, and etching of the mask, selectively with respect to the insulator, in order to bring the upper surface of the insulator back to the level defined by the lower surface of the mask.

The etching of the insulator may leave a residual layer of insulator above the level defined by the lower surface of the mask.

The residual layer may at least be partly removed during the etching of a surface layer covering the mask and/or at least partly removed during the etching of the mask.

The substrate may be etched beforehand in the area in which at least one portion of the insulator is formed, thereby forming an etched area in the semiconducting material.

The etched area in the semiconducting material may have a depth between 1 nm and 10 μm.

The semiconducting material may be in silicon or in $Si_{1-x}Ge_x$ ($0 \leq x \leq 1$) or in any other semiconducting material.

The insulating material may be in $SiO_2$, or $Al_2O_3$, or AlN, or SiON, or $Si_3N_4$, or diamond, or $HfO_2$, or in a dielectric material with a high dielectric constant.

The mask may for example be in nitride $Si_3N_4$, or $Al_2O_3$ or AlN.

The obtained component may be assembled, notably by molecular adhesion, with a second substrate, for example itself also in semiconducting material, and which may include an insulating, e.g. $SiO_2$, layer at its surface.

Next, one may proceed with a step for thinning the first and/or the second substrate, for example by forming a layer of porous material or by implanting ions, such as hydrogen ions and possibly helium ions, or by grinding, or by polishing or etching.

Both substrates may be of types with different conductivities.

The first and/or the second substrate may include at least a first conductivity area and a second conductivity area at the surface.

Notably, the second substrate may include at least one circuit or surface component portion.

The material of the first substrate as for it, may include electrically conducting areas and/or areas with different dopings.

The formation of an insulator through the mask may at least partly include thermal oxidation of the semiconducting substrate, and/or possibly additionally deposition of insulator or oxide.

By reiterating a method according to the invention, it is possible to produce several insulating areas in a same semiconducting substrate, these different areas being of different geometric characteristics and/or compositions.

First, the invention also relates to a method for producing a semiconducting structure, including the formation:

a) of a first insulating area in a semiconducting substrate, b) and then the formation of at least a second insulating area in the same substrate, steps a) and b) being carried out according to a method as described above.

Steps a) and b) may be carried out with different masks.

At least two of the formed insulating areas may have different depths and/or widths in the substrate and/or be formed in different insulating materials.

An insulating film may be produced on at least one of the two substrates.

The invention also relates to a semiconducting device, including a semiconducting substrate, at least one insulating area in this substrate, a surface of this insulating area being flush with the surface of the semiconducting material with an accuracy of less than ±5 nm.

It also relates to a semiconducting device, including a semiconducting substrate, at least one insulating area in this substrate, a conducting layer on the substrate outside the insulating areas, this conducting layer being possibly covered with a protective layer, a surface of the insulating area being flush with the surface of the conducting layer or possibly of the protective layer.

The conducting layer may be in silicide or in metal.

The surface of the insulating area may be flush with the surface of the conducting layer or possibly of the protective layer with an accuracy of less than ±5 nm.

A layer of an insulating material may cover the insulating area and the substrate or the conducting layer or the protective layer covering the conducting layer.

The semiconducting material may be in silicon or in $Si_{1-x}Ge_x$ ($0 \leq x \leq 1$).

The insulating material of the insulating area as for it, may be in $SiO_2$, or $Al_2O_3$, or AlN, or SiON, or $Si_3N_4$, or diamond, or $HfO_2$, or in a dielectric material with a high dielectric constant and/or in a combination comprising at least one of these materials.

SHORT DESCRIPTION OF THE DRAWINGS

Figure 8C:
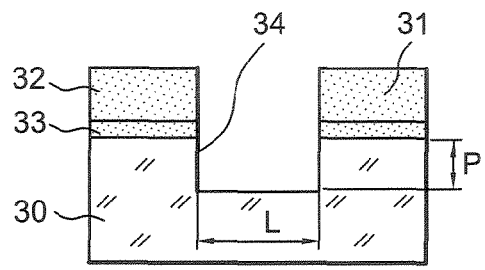
Figure 8D:
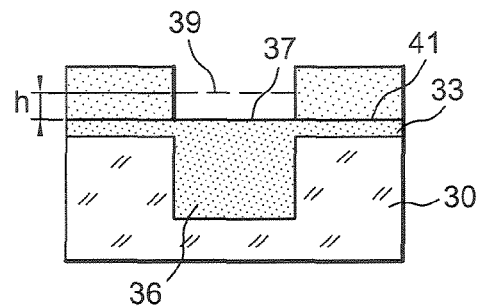
Figure 9A:
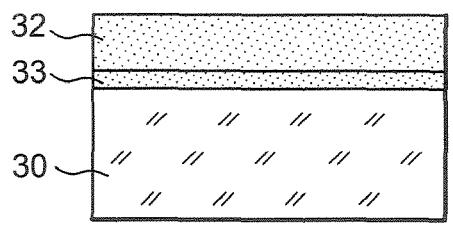
Figure 9B:
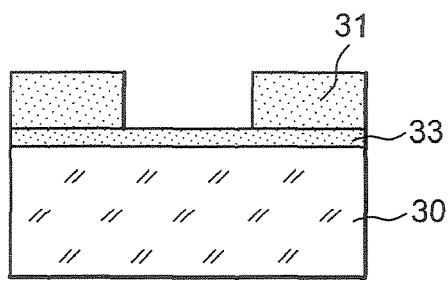
Figure 9C:
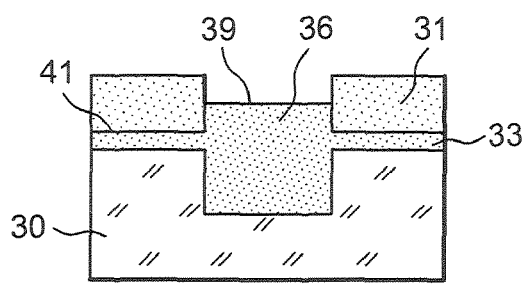
Figure 9D:
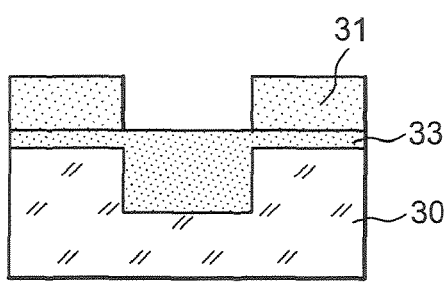
Figure 9E:
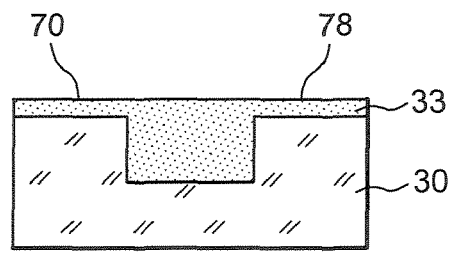
Figure 10A:
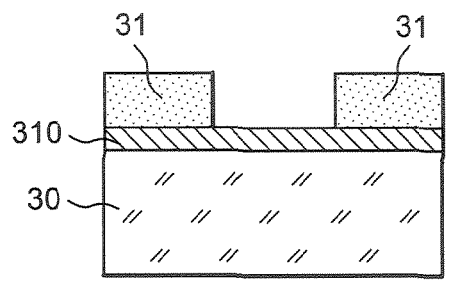
Figure 10B:
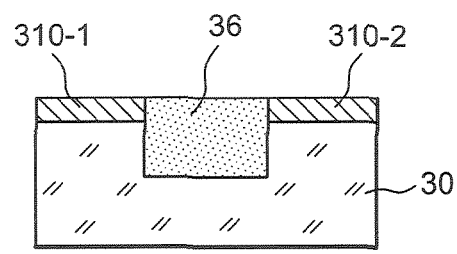
Figure 12A:
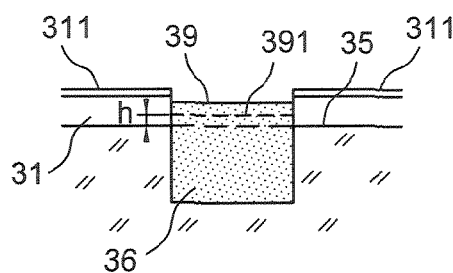
Figure 12B:
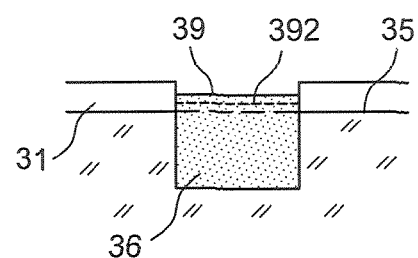
Figure 12C:
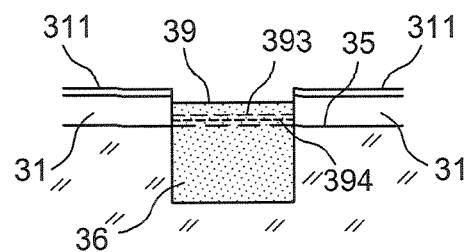
Figure 13A:
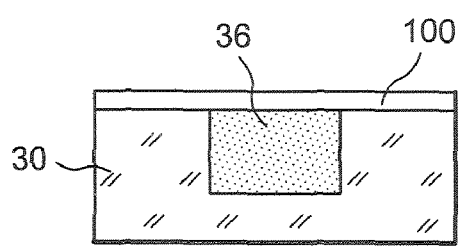
Figure 13B:
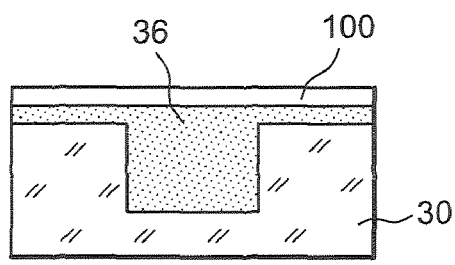
Figure 14:
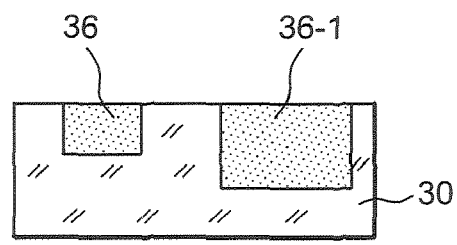

FIGS. 1A-5B illustrate known techniques and the problems posed by these techniques, FIGS. 6A-6J and 7A-7D illustrate steps of a method according to the invention, FIGS. 8A-8H and 9A-9E illustrate steps of another method according to the invention, FIGS. 10A and 10B illustrate another type of substrate which may be used within the scope of the present invention, with a conducting layer, FIGS. 11A-11E illustrate another type of substrate which may be used within the scope of the present invention, with a conducting layer and a protective layer, FIGS. 12A-12C illustrate alternative steps of a method according to the present invention, FIGS. 13A and 13B illustrate a component according to the invention with an insulating layer at the surface, FIG. 14 illustrates a component according to the invention with two different insulating areas, FIGS. 15A-18H illustrate exemplary methods according to the invention and alternatives of these examples.

DETAILED DISCUSSION OF PARTICULAR EMBODIMENTS

Figure 6A:
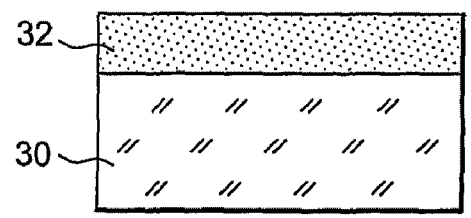
Figure 6B:
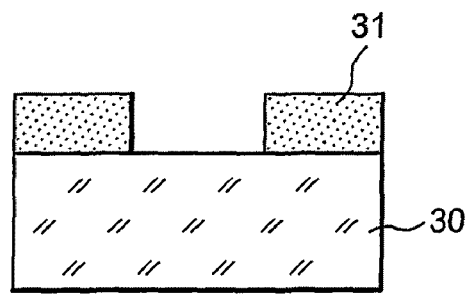
Figure 6C:
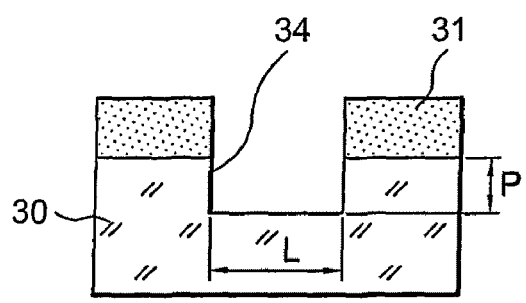
Figure 6D:
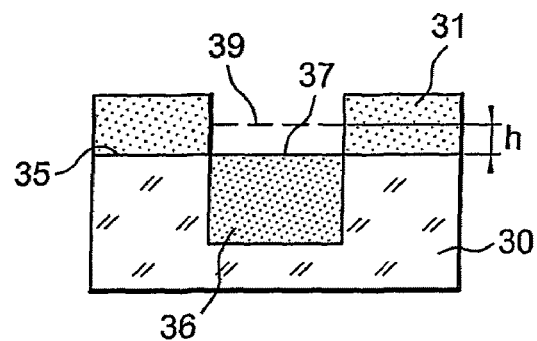
Figure 6E:
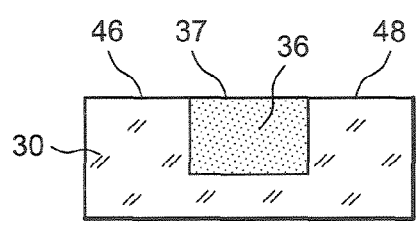

FIGS. 6C-6E illustrate a first embodiment of a method according to the invention.

Starting with a substrate 30 (FIG. 6C) in a semiconducting material, in which a trench 34 has been etched through a mask 31, growth or formation of an insulating material 36 is achieved (FIG. 6D) from the cavity 34 in a controlled way, so that the surface of this material reaches the interface 35 between the mask and the substrate 30.

The mask 31, with which a barrier protecting the semiconducting material may be formed during the growth or formation of the insulator, is then removed, leaving the insulating material flush with the surface of the material 30 (FIG. 6E). The accuracy of the alignment between both surfaces is compatible with subsequent proper molecular bonding, for example this accuracy is less than ±10 nm or ±5 nm. For example, for a mixed Si/SiO$_2$ surface, it is better than 10 nm (±5 nm), notably if it undergoes chemical cleaning, which leaves it hydrophilic.

The surface of the wafer or the substrate 30 is then planar and formed with an alternation of semiconducting areas 40, 48 and of insulating areas 37 (FIG. 6E).

The thereby structured semiconducting wafer may then be cleaned, for example with a view to bonding by molecular adhesion with a wafer, for example itself also in a semiconducting, virgin or structured material. Adherence of the wafers may for example be strengthened by heat treatment, and then at least one of the two wafers may be thinned (examples of thinning techniques will be provided later on).

Such a method does not require any thinning step by polishing before assembly, notably unlike the method of the prior art described in connection with FIGS. 1A-5B. At the very most, as this will be seen subsequently, slight polishing may be carried out in order to suppress or reduce irregularities or surface roughnesses, with a view to molecular bonding, for example.

According to one alternative, the insulator 36 grows up to a level 39 (FIG. 6D) located at a height h (for example between 1 nm and the thickness of the mask 31) above the interface 35 between the mask 31 and the substrate 30, here again with very good accuracy.

Etching is then carried out, preferably selectively with respect to the mask 31, at a controlled rate, with which the surface of the insulator may be brought back to the level 35 of the mask 31—substrate 30 interface or in proximity thereto, with an accuracy of less than ±10 nm or ±5 nm.

One may then proceed with removing the mask (FIG. 6E) and with cleaning the surface of the substrate 30, for example with a view to bonding by molecular adhesion.

No chemical-mechanical polishing step is required for bringing an upper insulator level higher than a semiconductor level by more than 30 nm, back to the level of the semiconductor.

Both the growth of the insulator and its optional etching are achieved at a controlled rate.

The growth or formation rate is for example between 0.1 nm/min and 5 nm/min or 10 nm/min.

The etching rate is for example between 0.01 nm/min and a few tens of nm/min, for example 50 nm/min.

The making of a trench in the semiconducting substrate 30 may be obtained from a virgin substrate 30 (for example in silicon, FIG. 6A) by depositing a film 32, for example a nitride film, and then by etching this film.

For example, photosensitive resin is spread over the surface of the film 32.

Next, patterns in the resin are transferred to the surface of the film 32 by photolithography.

After development of the photoresist, an ionic etching step is used, e.g. of the reactive ion etching type (RIE), for etching the film 32 and forming the mask 31 with the desired patterns.

Subsequently, the semiconducting wafer 30 is itself etched, for example again by ionic etching, according to the patterns of the mask 31 (FIG. 6C).

According to one alternative of the invention, the semiconducting wafer 30 is not etched. It is possible starting with the structure of FIG. 7A (a layer 32 on a semiconducting substrate 30, a substrate identical with that of FIG. 6A) to proceed with forming the mask 31 (FIG. 7B) by etching the layer 32, and then with thermally oxidizing the semiconducting wafer 30 through the mask 31 (FIG. 7C), but without etching the semiconducting substrate. The oxidation may occur up to a level 39 higher than that of the mask-semiconductor 30 interface 35. One then proceeds with removing the mask 31 (FIG. 7D). A structure similar to that of FIG. 6E is then obtained.

The surface of the wafer or of the substrate 30 is then planar and formed with an alternation of semiconducting areas 40, 48 and insulating areas 37 (FIG. 7D, a structure similar to that of FIG. 6E), here again with very good accuracy (less than ±10 nm or ±5 nm).

The thereby structured wafer may be cleaned with a view to bonding by molecular adhesion.

Cleaning here and more generally in the whole document means any surface preparation aiming at obtaining totally or partially hydrophilic or hydrophobic surfaces, this preparation may include heat treatments, and/or wet or dry or plasma chemical treatments, or even by CMP flushing (a chemical-mechanical polishing aiming at alleviating the surface microroughness, from less than 20 nm or 30 nm, without any risk of <<dishing>>, but this step does not aim at thinning an overthickness larger than 20 nm or 30 nm).

In order to obtain a first type of stacked structure, the thereby structured and cleaned wafer may be bonded for example onto a second wafer 50, for example in a virgin semiconductor (FIG. 6F), also cleaned with a view to molecular bonding. In order to increase adhesion of the wafers, the stacked structure is for example submitted to a heat treatment.

Figure 6F:
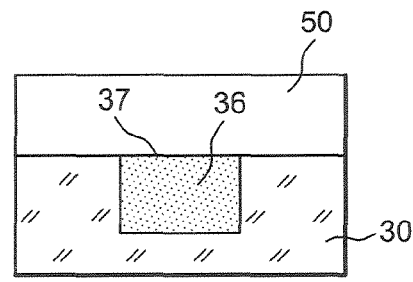
Figure 6G:
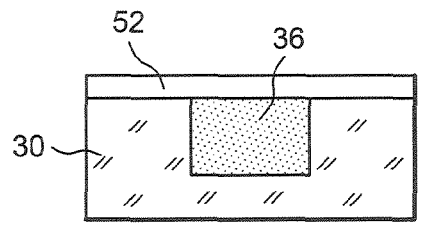

One of the wafers may then be thinned so as to obtain the desired surface film thickness 52 (FIG. 6G). With this structure, it is possible to provide an alternation of areas with vertical conduction and areas including an insulator 36 (SOI areas if the layer 52 is in Si, the area 36 in SiO$_2$ and the substrate 30 in Si).

According to one alternative (FIGS. 6I, 6J), it is the substrate 30 which, starting from the structure of FIG. 6F, is thinned, a portion 30-2 of this substrate being removed, leaving the other portion 30-1 in which the insulator 36 is produced. A thin film 30-1 with variable thickness if therefore obtained.

Figure 6H:
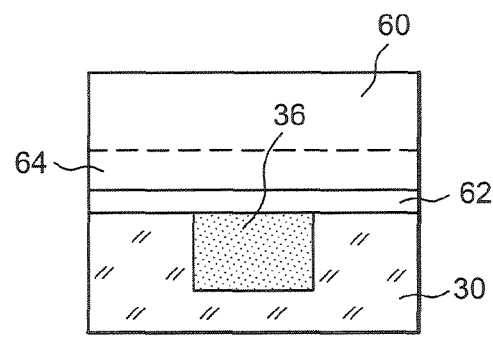
Figure 6I:
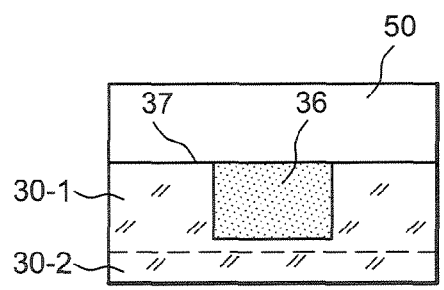
Figure 6J:
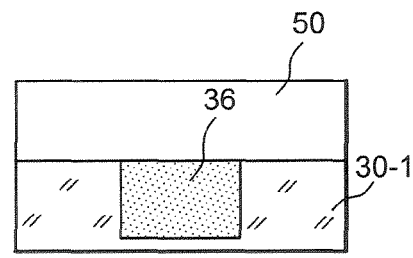

According to another alternative, and in order to obtain a second type of stacked structure, the structured and cleaned wafer 30 of FIG. 6E or 7D is bonded for example onto a second wafer 60, for example in a semiconductor, supporting an insulating film at the surface (for example a $SiO_2$ oxide layer 62) and also cleaned with a view to molecular bonding (FIG. 6H).

In this last approach, the insulating film, for example an oxide film, 62, of the second wafer will advantageously have a fine thickness, for example between a few nm and 50 nm.

In order to increase adhesion of the wafers, the stacked structure is for example submitted to a heat treatment.

One of the wafers is then thinned.

If it is the wafer 60 which is thinned, an alternation of areas with variable insulator thicknesses (alternating between the thickness of the film 62 and that of this film plus the one of area 36) is obtained.

If it is the structured wafer 30 which is thinned, an alternation of areas with variable thin film thicknesses (similar to the case of FIG. 6J) is further obtained.

Whichever the contemplated alternative, reduction of a portion of the thickness of one of the two bonded wafers may for example be accomplished by one of the following techniques:
- mechanical thinning, for example of the grinding type,
- chemical-mechanical polishing (but, once again, this step only polishes the surface and is not thinning over a significant thickness, for example larger than 20 or 30 nm),
- thinning by ionic and/or chemical etching,
- inclusion prior to bonding of an embrittlement area embedded in the wafer to be thinned (such as a porous area or by implanting gas species in one of the substrates, for example hydrogen ions or a hydrogen-helium mixture), and fracture at the level of this embrittled area, or any combination of at least two of these techniques.

In the method described above, in connection with FIG. 6A-6E or 7A-7D, the step for growing or forming the insulator, or the step for growing or forming and then etching the insulator, precede the step for removing the mask 31.

However, as illustrated in FIG. 12A, the growth of the insulator 36 may affect the surface of the mask by forming a surface layer 311 on the mask. For example, in the case of growth produced by oxidation, the oxidation may form a surface layer 311 on the mask 31. It is then sought to remove this layer 311 before removing the mask, because the techniques for removing both of these elements are generally not the same.

But removal of the layer 311 at the surface of the mask may well remove a portion of the insulator 36.

First, during the growth of the insulator, one therefore proceeds with overgrowth of the latter or with growth of the latter so as to reach a level higher than that of the mask 31—semiconducting substrate interface, as in the case of FIG. 6D or 7C (level 39).

During removal of the layer 311, a portion of the insulator 36 will also be removed, the overgrowth of which (the height h above the plane 35) was calculated so that, during this step, the upper surface of the insulator is brought back close to or at the level of the substrate-mask interface 35.

Adaptation of the height h is possible because of the controllability, and in particular of the controlled rate, during the growth and etching of the insulator. For example, the layer 311 is removed by etching with HF for a period of time proportional to its thickness. During this same period, HF etches the thickness h of the insulator 36 at a known rate (for example, 1% HF etches thermal $SiO_2$ at a rate of 6 nm/min).

After growth of the insulator 36 up to the level 39, one proceeds with the following steps:
(i) with removal, for example by etching the insulator 36, in order to bring its surface from level 39 back to a first intermediate level 391 (FIG. 12A),
(ii) with removal, for example by etching, of the layer 311 and of the residual height h of insulator,
(iii) with removal of the mask.

Both steps i) and ii) may occur in reverse order, (ii) and then (i).

Removing the mask 31 may also cause removal of a portion of the insulator 36.

Here again, during the growth of the insulator 36, first one then proceeds with overgrowth of the latter, or with growth of the latter so as to reach a level higher than that of the mask 31—semiconducting substrate interface, as in the case of FIG. 6D (level 39).

During removal of the mask 31, a portion of the insulator 36 will also be removed, the overgrowth of which (the height h above the plane 35) was calculated so that, during this step, the upper surface of the insulator reaches the level of the substrate-mask interface 35.

Adaptation of the height h is possible because of the controllability, and in particular of the controlled rate, during the growth and etching of the insulator. For example, for removing a 80 nm $Si_3N_4$ mask by means of $H_3PO_4$ acid at 160° C., it is known that 4 nm of $SiO_2$ thermal oxide are consumed.

After growth of the insulator 36 at the level 39, one therefore proceeds:
(i) with removal, for example by etching, of the insulator in order to bring its surface from level 39 back to an intermediate level 392 (FIG. 12B),
(ii) upon elimination or removal of the mask 31, with removing, for example by etching, the insulator residue located between level 392 and level 35, so as to bring the surface of this insulator back from level 392 to level 35.

Both problems, the formation of a surface layer 311 on the mask during the growth of the insulator on the one hand, the removal of a portion of the insulator 36 upon removal of the mask on the other hand, may be combined. The overgrowth h of the insulator 36 is then adapted according to the thickness of this insulator which will be consumed, both upon removal of the layer 311 and upon removal of the mask 31.

After growth of the insulator 36 up to level 39, one then proceeds (FIG. 12C):
(i) with removal, for example by etching, of the insulator in order to bring its surface from level 39 back to a first intermediate level 393, thereby leaving a residual thickness (small compared with the initial overthickness of the insulator),
(ii) with removal, for example by etching, of the layer 311, which brings the surface of the insulator from level 393 back to a second intermediate level 394, and this therefore reduces the residual layer of insulator,
(iii) upon removal or elimination of the mask 31, with removing, for example by etching, the insulator residue located between the second intermediate level 394 and level 35.

Both steps i) and ii) may occur in the reverse order, (ii) and then (i).

In the 3 cases discussed above in connection with FIGS. 12A-12C, the insulator might initially have been grown above the level 35 exclusively for taking into account etching of the insulator 36 during the removal of a layer 311 and/or during removal of the mask, therefore only up to the level 391, 392 or 393. Step i) is then suppressed.

The overgrowths have variable thicknesses, according to the growing and removal methods used. Typically, for a $Si_3N_4$ nitride mask and a $SiO_2$ insulator, the levels 391 and 393 may for example be estimated to be at about 20 nm and the level 392 at about 5 nm above the interface 35.

In order to simplify the method as much as possible, and to limit the successive steps for removing the overgrowth of the insulator, the mask 31 is selected in a material having etching selectivity relatively to the insulator 36.

Preferably, the ratio of the etching rate of the mask over the etching rate of the insulator is larger than 2 or 5 or 10 or 100. It is 20 in the case of etching by $H_3PO_4$ at 160° C. for a $Si_3N_4$ mask and thermal $SiO_2$ as an insulator.

Let us now consider the example of silicon as a semiconducting material of the substrate 30, of thermal silicon dioxide as an insulating material 36 and silicon nitride as the material of the mask 31. The method is the one of FIGS. 6E-6J.

Silicon nitride in this example is advantageous because it forms a good barrier to oxidation of silicon and therefore to the underlying areas of this mask. For example, 10 nm may be sufficient for providing this barrier effect.

Thermal oxide $SiO_2$ 36 may therefore be generated in the etched patterns of the silicon (FIG. 6D).

During thermal oxidation, oxygen atoms penetrate into the lattice of silicon, which causes swelling of the latter. By this swelling, the surface of the oxide being formed gets closer to the nitride surface of the mask 31.

It may be considered that the height of generated oxide is about twice the height of silicon subject to oxidation.

As the rate of formation of the oxide is under control, it may be stopped when the height of generated oxide reaches the level of the interface 35 between the silicon 30 and the nitride mask 31.

In one alternative (FIG. 6D), the oxide is formed above the substrate 30—mask 31 interface. The surface 39 of the oxide is then above the silicon-nitride interface 35. This is the case for example when by simply filling the etched area, a sufficient height of oxide cannot be obtained with the etching depth.

Next, a selective thinning method is then used at a controlled rate, with which the surface of the oxide 37 may be stopped close to or at the level of the silicon-nitride interface 35.

For example, this thinning method may be chemical etching by 1% diluted hydrofluoric acid, the rate of which for etching $SiO_2$ thermal oxide is of the order of 6 nanometres per minute, while it does not etch the nitride of the mask 31.

More generally, etching may be used, for example chemical etching allowing a rate between 0.01 nm/min and a few tens of nm/min, 30 nm/min or 50 nm/min for example.

When the surface of the oxide is brought back to the silicon-nitride interface 35, the mask 31 may be removed, for example by using etching with orthophosphoric acid, for example at 160° C. This etching may be considered as not very active for the thermal oxide (a selectivity larger than 20 was measured).

In an alternative where the surface of the nitride mask 31 is not etched by orthophosphoric acid (notably if this surface was oxidized during oxidation of silicon, the case of FIG. 12A), a first etching with a hydrofluoric acid based solution may be considered before etching with orthophosphoric acid. An overthickness h of the oxide is then provided above the silicon/nitride interface 35, an overgrowth corresponding to what will be removed by the etching based on hydrofluoric acid. As the formation of the oxide is achieved at a controlled rate, this overthickness is itself also under control.

In one alternative, where orthophosphoric acid would etch silicon oxide 36 (for example for a different solution temperature or dilution), an overthickness of this oxide above the silicon-nitride interface 35 may be produced here again by controlling the rate of formation of the oxide 36, an overthickness corresponding to what will be removed by etching with orthophosphoric acid.

More generally, an overthickness of the insulator may therefore be achieved, for the case where removal of the mask would cause etching or removal of this insulator.

Oxidation is performed under conditions such that the thermal oxide is formed at a slow rate, so that the level reached by the oxide pad 36 may be controlled easily.

For example, oxidation is achieved under a moist atmosphere, for example steam or water vapor, at a temperature for example between 650° C. and 1,150° C., or between 900° C. and 1,000° C. Under these conditions, the oxide is formed at a rate between about a few tenths of nm/min and a few nm/min depending on the oxidation temperature, which makes the process quite controllable. This rate is about 5 nm/min at 950° C. It further depends on the oxidation time. For more specific details on these rates, reference may be made to standard microelectronic handbooks such as the Handbook of Semiconductor Technology, Ed. W. C. O'Mara, Noyes Publications (1990).

According to another example, oxidation is achieved under a dry oxide atmosphere, at low temperature, for example between 700° C. and 800° C. or between 700° C. and 1,200° C. Under these conditions, the oxide is formed at a rate of about a few tenths of nm/min to a few nm/min. The process remains quite controllable with for example a rate of the order of 0.5 nm/min at 900° C.

Finally, the surface of the wafer is planar and formed with an alternation of silicon areas 40, 48 and thermal oxide areas 37 (FIG. 6E), the alignment accuracy between the surfaces may be less than ±10 nm or ±5 nm. The thereby structured silicon wafer may be cleaned with a view to bonding by molecular adhesion.

What is meant by cleaning was already indicated above.

In order to obtain a first type of stacked structure, the thereby structured and cleaned silicon wafer may for example be bonded onto a second wafer 50 of virgin silicon (FIG. 6F) also cleaned with a view to molecular bonding, so as to form a so-called <<partial silicon-on-insulator>> (PSOI) structure.

In a first bonding method, the wafers are cleaned in order to make the exposed silicon areas hydrophobic. In a second bonding method, the wafers are cleaned in order to make the exposed silicon areas hydrophilic which then have very fine oxide at the surface, typically less than 2 nm. In order to increase the adhesion of the wafers, the stacked structure is for example submitted to a heat treatment. In particular in the case of hydrophilic surface bondings, and advantageously, heat treatment may be used for getting rid of the very fine film of oxide generated by the cleaning.

Next, one of the wafers may be thinned in order to obtain the intended thickness of silicon surface film 52 (FIG. 6G). With this structure, it is possible to position vertical conduction areas and SOI areas alternately.

According to one alternative (FIGS. 6I, 6J), it is the substrate 30 which is thinned, a portion 30-2 of this substrate being removed, leaving the other portion 30-1 in which the insulator 36 is produced. An alternation of thin film 30-1 with variable thickness is therefore obtained.

According to another alternative, and in order to obtain a second type of stacked structure, the structured and cleaned silicon wafer is for example bonded onto a second wafer of oxidized silicon 60 (oxide layer 62) and also cleaned with a view to molecular bonding, in order to form a so-called <<multisilicon-on-insulator>> (MSOI) structure (FIG. 6H).

In this last approach, the oxide film 62 of the second wafer will advantageously have a fine thickness, for example between a few nm, for example 5 nm, and 50 nm.

In order to increase the adhesion of the wafers, the stacked structure is for example submitted to a heat treatment.

One of the wafers is then thinned.

If it is the oxidized silicon wafer 60 which is thinned, an alternation of SOI areas with variable oxide thickness (alternating between the thickness of the film 62 and that of this film plus the one of the area 36) is obtained.

Further, if it is the structured silicon wafer 30 which is thinned, an alternation of SOI areas with variable thin film thickness (in a similar way to the case of FIG. 6J) is obtained.

Reducing a portion of the thickness of one of the two bonded wafers may be accomplished for example by one of the techniques already mentioned above (mechanical thinning, for example of the grinding type, and/or chemical-mechanical polishing over a very small thickness (less than 20 nm or 30 nm), and/or thinning by ionic and/or chemical etching, and/or inclusion, prior to bonding, of an embrittlement area embedded in the wafer to be thinned and then fracture).

In the example above, only $SiO_2$ thermal oxide is used. It is also possible to produce thermal oxide up to a certain level, and/or to achieve deposition of another insulator, for example deposited by PECVD in the trench 34.

However, in this case, a thin film of this other insulator might also be deposited on the mask, in which case, one may proceed with preparatory CMP type polishing of the surface of the mask 31.

A second embodiment of a method according to the invention will be described in connection with FIGS. 8A-8E.

Starting with a substrate 30 (FIG. 8C) in semiconducting material, covered with an insulating layer 33, in which a trench 34 was etched through a mask 31, growth of an insulating material 36 is achieved in a controlled way (FIG. 8D), for example, in the range of rates between 0.1 nm/min and a few nm/min, for example 5 nm/min or 10 nm/min, so that the surface 37 of this material reaches the interface 41 between the mask and the insulator 33.

The mask 31 is then removed, leaving the insulating material 36 of the trench flush with the surface of the insulating layer 33 (FIG. 8E), and this with a tolerance compatible with molecular bonding, for example with dishing less than about 5 nm.

Figure 8E:
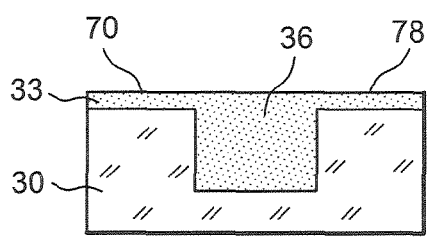

The surface of the wafer or of the substrate 30 is then planar and formed with an alternation of fine insulating areas 70, 78 and of thicker insulating areas 37 (FIG. 8E).

The thereby structured semiconductor wafer may then be cleaned, for example with a view to bonding by molecular adhesion.

It may be assembled with a wafer in semiconducting, virgin or structured material. Adhesion of the wafers may be strengthened for example by heat treatment, and then at least one of the two wafers may be thinned (examples of thinning techniques have been given above).

Such a method therefore does not require any thinning step by chemical-mechanical polishing before assembly, unlike the prior art. At the very most, during the preparation of the wafers, for assembly by molecular bonding, slight polishing may be performed in order to remove irregularities of the order of 20 nm or 30 nm at the most, but this step does not risk causing the problems encountered in the prior art and discussed in connection with FIGS. 5A and 5B.

According to one alternative, the insulator 36 grows up to a level 39 (FIG. 8D) located at a height h above the mask 31—insulator 33 interface.

Next, etching, preferably selective etching, relatively to the mask 31 is carried out at a controlled rate, with which the surface of the insulator may be brought back close to or at the level 41 of the mask 31—insulator 33 interface and this with a tolerance compatible with molecular bonding, for example with dishing less than about 5 nm.

One may then proceed with removal of the mask (FIG. 8E) and possibly with cleaning the surface of the insulator 33, for example with a view to bonding by molecular adhesion. Here again, no thinning step by chemical-mechanical polishing is required. The homogeneity of the obtained surface is less than 5% or 4% or 3%.

Both growth of the insulator and its possible etching are achieved at a controlled rate, for example as already indicated above, between 0.1 nm/min and a few nm/min, 5 nm/min or 10 nm/min for example.

Production of the structure of FIG. 8C is achieved in the following way.

Before depositing or forming the film or the layer 32, an initial insulator film 331 is produced with a certain thickness obtained in the case of $SiO_2$, for example by thermal oxidation at high temperature of silicon wafer (FIG. 8A).

The following steps take into account the presence of this insulating film, which is etched (FIG. 8B) after etching the film 32 and before etching the substrate 30 (FIG. 8C), in order to transfer the defined patterns during the lithography step.

According to an alternative of the invention, the semiconducting wafer 30 is not etched. Starting with the structure of FIG. 9A (layers 33 and 32 on a semiconducting substrate 30, an identical structure with that of FIG. 8A), one may proceed with forming the mask 31 (FIG. 9B) by etching the layer 32, without etching the layer 33, and then with thermal oxidation of the semiconducting wafer 30 through the mask 31 (FIG. 9C). The oxidation occurs up to a level 39 higher than that of the mask-layer 33 interface 41. Next, one proceeds with etching the insulator overthickness, in order to bring the surface of the latter back close to or at the level 41 (FIG. 9D), and then with removal of the mask 31 (FIG. 9E). A structure similar to the one of FIG. 8E, is then obtained with the same homogeneity characteristics.

The surface of the wafer or of the substrate 30 is then planar and formed with an alternation of fine insulator areas 70, 78 and thicker insulating areas (FIG. 9E, a structure similar to that of FIG. 8E).

The thereby structured wafer may be cleaned with a view to bonding by molecular adhesion.

The term of cleaning has already been explained above and is repeated here with the same meaning. In particular, an optional chemical-mechanical polishing may be performed in order to alleviate the surface microroughness to less than 20 nm or 30 nm, without any risk of causing the problems posed by the prior art (cf. FIGS. 5A, 5B), and not for thinning an overthickness larger than 20 nm or 30 nm).

In order to obtain a first type of stacked structure, the thereby structured and cleaned plate may for example be bonded onto a second wafer 50, for example in a virgin semiconductor (FIG. 8F), also cleaned with a view to molecular bonding. In order to increase the adhesion of the wafers, the stacked structure is for example submitted to a heat treatment.

Figure 8F:
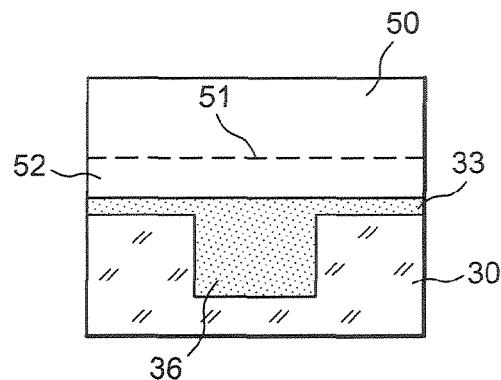

One of the wafers may then be thinned, for example the wafer 50 is thinned as far as a plane 51 in order to obtain the intended surface film thickness 52 (FIG. 8F). With this structure, it is possible to alternately position vertical conduction areas and areas including an insulator 36 (SOI areas if the layer 52 is in Si, the insulating areas are in $SiO_2$ and the substrate 30 is in Si).

According to an alternative (FIG. 8H), it is the substrate 30 which is thinned from the structure of FIG. 8F, a portion 30-2 of this substrate being removed, leaving the other portion 30-1 in which the insulator 36 is produced. A thin film 30-1 with variable thickness is therefore obtained.

According to another alternative, and in order to obtain a second type of stacked structure, the structured wafer 30 of FIG. 8E or 9E is cleaned and bonded for example onto a second wafer 60 (FIG. 8G), for example in a semiconductor, oxidized at the surface (oxide layer 62) and also cleaned with a view to molecular bonding.

In this last approach, the oxide film 62 of the second wafer will advantageously have a fine thickness, for example between a few nm and 50 nm.

In order to increase the adhesion of the wafers, the stacked structure is for example submitted to a heat treatment.

One of the wafers is then thinned.

If it is the wafer 60 which is thinned, an alternation of areas with variable insulator thickness (alternating between the thickness of the film 62 plus the one of the layer 33 and that of both of these films plus the one of area 36) is obtained.

Further, if it is the structured wafer 30 which is thinned (reference 30a denoting the thinning plane), an alternation of areas with variable thin film thickness (in a similar way to the case of FIG. 6J) is obtained.

Reducing a portion of the thickness of one of the two bonded wafers may for example be achieved by one or several of the techniques already mentioned (mechanical thinning, and/or chemical-mechanical polishing (but, once again, this step only polishes the surface and is not thinning over a significant thickness, for example larger than 20 or 30 nm), thinning by ionic and/or chemical etching, inclusion prior to bonding of an embrittlement area embedded in the wafer to be thinned and fracture at the level of this embrittled area).

As explained above in connection with FIGS. 12A-12C, further growth of the insulator may be appropriate for the case when the growth of the insulator affects the surface of the mask, and/or for the case when removal of the mask causes that of a portion of the insulator 36.

Here again, in order to simplify the method as much as possible, and to limit the successive steps for removing the overgrowth of the insulator, the mask 31 is selected in a material having etching selectivity relatively to the insulator 36.

Preferably, the ratio of the etching rate of the mask over the etching rate of the insulator is larger than 2 or 5 or 10 or 100.

Let us now consider the example of silicon as a semiconducting material of the substrate, of silicon dioxide as the insulating material and silicon nitride as the material of the mask 31.

Thermal oxide 36 is generated at a controlled rate in the etched patterns 34 (FIG. 8D), oxygen atoms penetrating into the silicon lattice and causing swelling of the latter.

The generated oxide height is preferably such that the surface 37 of the oxide corresponds at least to the interface 41 between the nitride 32 and the silicon oxide 331 produced initially.

In an alternative, this oxide height may be more significant. For example this is the case when only the mask is etched. The surface 39 of the oxide is then found to be above the initial oxide-nitride interface 41, at a height h (FIG. 8D). A selective thinning method is then used with which the surface of the oxide may be located with sufficient accuracy at the initial oxide/nitride interface. For example, this thinning method is chemical etching with 1% diluted hydrofluoric acid, the rate of which for etching thermal oxide is of the order of 6 nanometers per minute, while it does not etch the nitride.

More generally, etching may be used, for example chemical etching allowing a rate between 0.01 nm/min and 99 nm/min.

The steps described in connection with FIGS. 6A-6E are transposable in this alternative method, the <<nitride/silicon>> interface being replaced with the <<nitride/initial oxide>> interface.

The considerations discussed above and relating to the etching by orthophosphoric acid, and optionally hydrofluoric acid, as well as to the use of a possible overthickness of the oxide remain valid as well as the thermal oxidation conditions.

After the nitride removal step, the surface of the wafer is formed with an alternation of areas of not very thick, initially produced thermal oxide 70, 78 and of areas 36 of thicker thermal oxide, produced in the etched patterns. The thereby structured silicon wafer is cleaned with a view to bonding by molecular adhesion.

It is then bonded, for example onto a virgin silicon wafer 50 (FIG. 8F) or onto an oxidized silicon wafer 60 (FIG. 8G) also cleaned with a view to molecular bonding. Reference 62 denotes a surface oxide layer of the wafer 60. By such a method, structures are obtained with alternating SOI areas with variable oxide thickness, called <<multisilicon-on-insulator>> (MSOI) areas.

It may also be bonded with a second wafer as obtained in FIG. 8E. Here again, an MSOI structure is obtained.

Figure 8G:
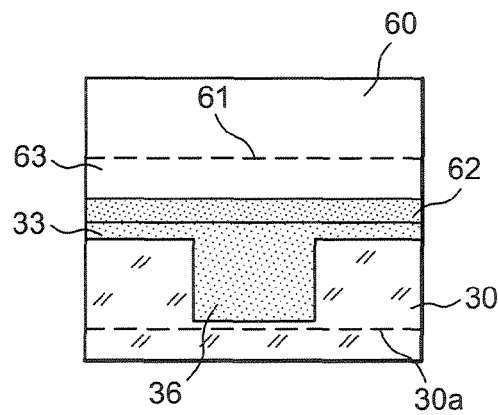

One of the two wafers may for example be thinned in order to obtain a silicon film 52, 63 (FIGS. 8F, 8G).

Generally, and beyond the example given above relating to $SiO_2$ and silicon, an alternative of this method may allow a PSOI to be produced.

Indeed, at the end of the second method described above (FIG. 8E), the wafer is formed with thin insulator areas 70, 78 and thick insulator areas 36, with a planar surface. It is therefore possible to globally etch this surface in order to run into the semiconducting material 30 after having removed an insulator thickness corresponding to the thickness of the thin insulator areas 70, 78. This oxide etching may be achieved in different ways: by a chemical solution, by plasma, by ion bombardment . . . . A type of etching is selected for which the difference between the etching rate of the semiconductor and that of the insulator is as small as possible (the ratio of the etching rates being less than 2 typically).

In the case of the $SiO_2$/silicon pair, a solution based on diluted HF is possible, but then it is delicate to control the stopping of the etching. On the other hand, a solution based on $NH_4OH/H_2O_2/H_2O$, has an etching rate ratio less than 2, which is more favorable. In the same way, etching by ion bombardment has a small etching rate difference.

In order to increase the adherence of the wafers during an assembly, the stacked structure is for example submitted to a heat treatment. One of the wafers is thinned in order to obtain the intended thickness(es) of silicon surface film.

Reducing a portion of the thickness of one of the two bonded wafers, in order to obtain the correct thickness of the silicon surface film and to achieve the desired MSOI or PSOI structures, may for example be achieved by one of the techniques described above or by any combination of at least two of these techniques.

The achieved structures may result from a combination of various alternatives of the method.

The method may be applied to various doping semiconductor wafers within the same wafer, for example a silicon wafer may be p+ doped at the vertical conduction areas (where there are no insulator areas), whereas the other areas are not doped or have different doping. In the case of FIG. 8E, it is possible to have for example different dopings under the fine layers 70, 78 and under the thick areas 36. This may be obtained, for example prior to etching, for the area under the mask and after etching, for the area under the insulator 36. There may also be an assembly of a first and second wafer with different dopings, for example a n type Si wafer 30 and a p type Si wafer 50, 60.

Alternatively (FIG. 10A), a film 310 with high conduction may be made in the areas protected by the mask 31, for example a silicide or metal film in the areas protected by a nitride mask.

For example a silicide or metal film 310 may be deposited prior to depositing the nitride film 31. Advantageously, this film with high conduction, for example in silicide or in metal, localized at the base of the bridges (the so-called non-etched areas of the substrate), is compatible with the temperature of the heat treatment for generating the insulator, for example the oxide, in the etched patterns. For example, this film 310 is a tungsten silicide film ($WSi_2$) or a tungsten film (which will subsequently react with the underlying silicon, during the heat treatment).

Finally, application of the method of FIGS. 6A-6E to this structure, leads (FIG. 10B) to structuration of the surface, including an alternation of insulating areas 36 and of highly conducting areas 310-1, 310-2. These different areas may be aligned with very good accuracy, to less than ±10 nm or ±5 nm. Steps for assembly with another substrate, as illustrated in FIGS. 6F-6J may be performed with such a structure.

In certain cases, the highly conducting film 310 will be protected from the etchant used for removing the mask 31 (for example $H_3PO_4$). This protection may be a very fine stopping layer 410 (for example in $SiO_2$) (see FIG. 11A which moreover repeats the other references of FIG. 10A in order to designate identical or similar elements therein).

Subsequent steps may take place for etching (FIG. 11B), for forming (growth or deposition) the insulator 36 (FIG. 11C), for removing the mask (FIG. 11D).

Let us note that there may be a benefit from having a highly conducting area, under a buried insulator, for example under a buried oxide of an SOI, and elsewhere, a very resistive (for example with a resistivity larger than 1 k$\Omega$·cm) substrate (for example in silicon) for microwave frequency applications. In such a case, the highly conducting area 310 may correspond to a ground plane.

It is therefore possible to stop at this step; the component of FIG. 11D may be used as such, without removing the protective layer 410.

If this protective layer 410 (FIG. 11E) is further removed, a structure such as the one of FIGS. 8E and 9E is obtained (but with conducting portions between the insulator areas 36).

Figure 8H:
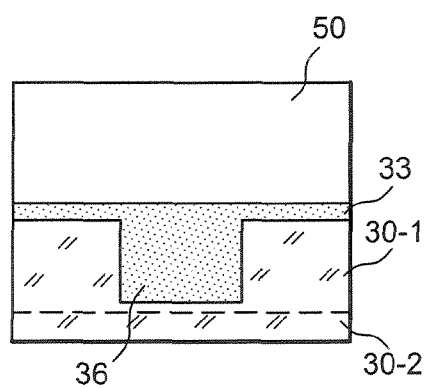

The steps of FIGS. 8F-8H may then be applied to this structure.

In the various examples given above, the example of silicon was given, but a method according to the invention may be applied to semiconductors other than silicon, for the first wafer 30 and/or for the second wafer 50, 80, 82. For example, $Si_{(1-x)}Ge_{(x)}$ with $0 \leq x \leq 1$ will be mentioned.

The thickness of the initial oxide film 33 may be in the range from 1 nm to a few tenths of micrometers, 0.1 or 0.5 µm for example.

The depth (P in FIGS. 6C and 8C) of the etched patterns 34 in the substrate may be from a few nanometers to a few micrometers, for example between 5 nm and 2 µm. It is zero in the case of FIGS. 7A-7D and 9A-9E, which illustrate embodiments without any etching of the substrate.

Generally, in order to produce controlled growth of the insulator, it is sought to know the depth p with some accuracy.

If this depth is relatively small, with certain means it may be measured accurately (for example: optical or mechanical profilometers, or an optical interferometer or ellipsometer).

If this depth is larger, it is possible to use the upper plane of the mask 31 as a reference: the thickness of this mask is known with accuracy (for example by ellipsometry). The insulator is then formed up to a level 39 which is raised relatively to the mask-substrate (FIG. 6D or 7C) or mask-insulating layer (FIGS. 8D and 9C) interface. The difference in height between the superficial surface of the mask and that of the insulator then becomes of an order of magnitude which is measurable with the means indicated above.

The side dimensions (L in FIGS. 6C and 8C) of the patterns 34 will typically be in the range from 0.1 µm to a few millimeters, for example 5 mm.

Adaptation of the thickness of the insulator 36 in the etched patterns 34 may be achieved by various techniques providing selective etching of the insulator in the etched patterns but no (or little) etching of the mask 31. For example, $SiO_2$ is etched by 1% HF, hence an etching rate of 6 nm/min whereas there is no etching of the $Si_3N_4$ mask with this acid. For example reactive ionic etching will be mentioned.

The thickness of the superficial semiconductor films achieved by thinning one of the wafers of the stacked structure (52 or 30) will for example be between a few nanometers and a few tens of microns, for example between 1 nm and 5 nm and 10 µm or 50 µm or 100 µm.

In producing structures of the MSOI type, the fine insulator may also be developed on at least one of the two wafers to be bonded (deposition, growth . . . ) after the step for preparing the structured surface.

The method may also be easily adapted with insulators other than silicon oxide $SiO_2$, as a fine film 331 of an initial insulator deposited before the nitride and/or as a fine film of insulator developed on the second wafer, and/or as a fine film of an insulator developed in an additional step, on a structured wafer as illustrated in FIG. 6E. For example $Al_2O_3$, or AlN, or SiON, or $Si_3N_4$, or diamond, or $HfO_2$, or any dielectric with a high dielectric coefficient K (traditionally called a material of high K type in microelectronics) or any combination comprising at least one of these materials, will be mentioned.

The method may be used with barrier films other than the nitride $Si_3N_4$ film 32. For example, $Al_2O_3$ or AlN films may be used. Selective removal with respect to the insulator 331 will for example be accomplished by chemical etching in a solution of $NH_4OH:H_2O_2:H_2O$ for $Al_2O_3$ and chemical etching in a solution of TMAH (tetramethylammonium hydroxide) for AlN.

The method may be repeated several times on the same first wafer, so that SOI areas may thereby be produced with various thicknesses of buried oxide.

In the method and the various exemplary embodiments, it is possible to apply steps for strengthening molecular bonding (by specific cleaning of the surfaces, or activation of the surfaces by plasma, or bonding under a specific atmosphere, or heat treatments . . . ).

It is also possible to carry out fine polishing of the chemical-mechanical type (touch polishing) in order to improve the microroughness of the oxide surfaces. This treatment is considered as a surface treatment (very slight removal of material, of the order of 1 nm to 30 nm) as opposed to the thinning method by polishing with which topography of oxide surfaces may be salvaged at a large scale.

In the methods explained above, the surface of the insulator 36 may be specifically controlled by limiting the growth rate or the etching rate when a removal needs to be carried out (case of the insulator level 39 above the mask-semiconductor interface (FIG. 6D) or the initial insulator-mask interface 41 (FIG. 7D) or the conducting film-mask interface (FIG. 10B)).

It is further possible, by using for example optical techniques for measuring thicknesses of the films, such as notably ellipsometry, to accurately align the surface of the insulator 36 produced in the patterns and of the interface.

In any case, the method according to the invention does not require any thinning by chemical-mechanical polishing, and therefore suppresses the risks mentioned in the introduction in connection with FIGS. 5A and 5B.

Chemical-mechanical polishing may be performed during the finishing of the surface(s) to be put into contact, but, once again, this step only polishes the surface in order to remove from it certain surface roughnesses, with a relief of at most a few nm and at most 20 nm, or 30 nm, and is not thinning over a significant thickness, for example larger than 20 or 30 nm.

With a method according to the invention it is possible to achieve a semiconducting structure, such as the one of FIG. 1B, including insulating areas, for example at least one first insulating area at the surface, or buried if the substrate is assembled with a layer such as the layer 45, this first insulating area having a first non-zero preferably uniform thickness, thickness, and at least one second insulating area at the surface, or buried if the substrate is assembled with a layer such as the layer 45, having a second non-zero, preferably uniform thickness and different from the first thickness.

With the method according to the invention, it is possible to achieve 3 (or more) different insulator thicknesses in a same substrate. For this, it is possible to reiterate the method with several levels of masks which are deposited consecutively. It is also possible to produce cavities with different depths, to generate the oxide or the insulator, and then to handle the local oxide overthicknesses by localized etchings.

With a method according to the invention, it is possible to achieve a semiconductor structure, such as the one of FIG. 2B, including insulating areas, for example at least one first insulating area at the surface, or buried if the substrate is assembled with a layer such as the layer 245, with a first non-zero, preferably uniform thickness, and at least one second semiconducting area at the surface or buried, if the substrate is assembled with a layer such as the layer 245.

With this method, if it is reiterated, it is possible to produce 2 different thicknesses p and/or two different insulator widths L in a same substrate, alternating with semiconducting areas.

Areas 36 in a first type of insulator followed by areas of another type of insulator may also be produced.

FIG. 14 illustrates a semiconducting substrate 30 with insulating areas 36, 36-1 which may be different by their geometric dimensions (depth and/or width) and/or by the natures of the materials which make them up.

These different insulating areas are obtained by reiterating a method according to the invention, with different masks during different steps for forming the different insulating areas.

With a method according to the invention, it is possible to produce a semiconductor structure, such as the one of FIG. 8B, including insulating areas, for example at least one first insulating area at the surface or buried, with a first non-zero, preferably uniform thickness, and at least one second conducting area at the surface or buried, with a second, preferably uniform thickness, possibly different from the first thickness.

Whichever the considered embodiment, it is possible to form a film of insulating material on a component according to any of the above methods. For example, in FIGS. 13A and 13B, the structures of FIGS. 6E and 8E are illustrated with such an insulating film 100, for example in AlN. If there is assembly with another substrate, such a film may be present on the surface of this other substrate.

When a component according to the invention is assembled with a second substrate (see for example FIG. 6F-6J, or 8F-8H), the second substrate 50, 60 may include at least one area with a first conductivity and an area with a second conductivity at the surface. It may also include at least one circuit or surface component portion intended to be the face for assembling with the substrate 30. The second substrate may therefore itself also be structured. The assembling with the first substrate may then apply an alignment of both substrates.

During an assembly with a second substrate, it was indicated that in order to increase the adhesion of the wafers or the substrates, the stacked structure may be submitted to a heat treatment. In addition, if the heat treatment is carried out at a high temperature (for example greater than or equal to 1,100° C.) an extremely fine residual oxide may be caused to disappear at the bonding interface. With a view to facilitate disappearance of this possible interface oxide, one will try as much as possible to minimize the crystallographic misalignment between two assembled substrate (for example silicon) wafers.

Other exemplary embodiments will now be provided:

First Example

In this first example, the nitride film 32 is deposited by a plasma enhanced chemical vapor deposition (PECVD) technique or by a low pressure chemical vapor deposition (LPCVD) technique. This film has a thickness of 80 nanometers (FIG. 6A). The patterns 34 are etched in the nitride and in the silicon with a reactive ion etching (RIE) type method and have a depth of 50 nanometers in the silicon (FIG. 6C).

The thermal oxide 36 is obtained in these patterns by heat treatment at 900° C. under a steam atmosphere. Its thickness is 100 nanometers. The surface 37 of the generated oxide in the etched patterns is at the level of the nitride-silicon interface 35.

The thereby structured wafer is submitted to chemical etching by orthophosphoric acid at 140° C. The areas covered with nitride are exposed. The structured wafer is planar, smooth, and compatible with subsequent molecular bonding.

The wafer is then cleaned in order to suppress the possible hydrocarbons, to remove the particles and to make the surface hydrophilic.

This first structured wafer is then bonded onto a second wafer 60 of oxidized silicon, the thickness of the oxide film being 20 nanometers (FIG. 6H), this second wafer being cleaned according to the same method. The stacked structure is submitted to a heat treatment at 1,100° C. for 2 hrs under an argon atmosphere. The second silicon wafer of this stacked structure is then thinned, for example by a grinding technique in order to only leave 25 micrometers of silicon 64, for example. An MSOI type stacked structure is obtained in this way.

Figure 15A:
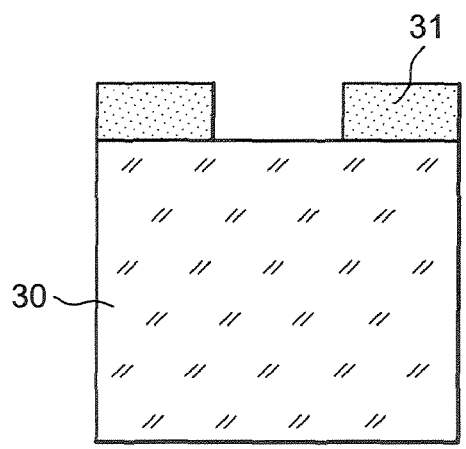
Figure 15B:
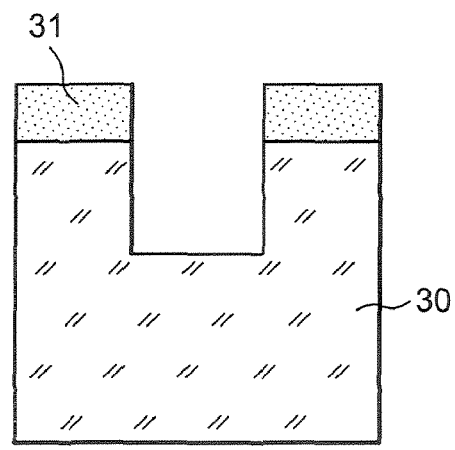
Figure 15C:
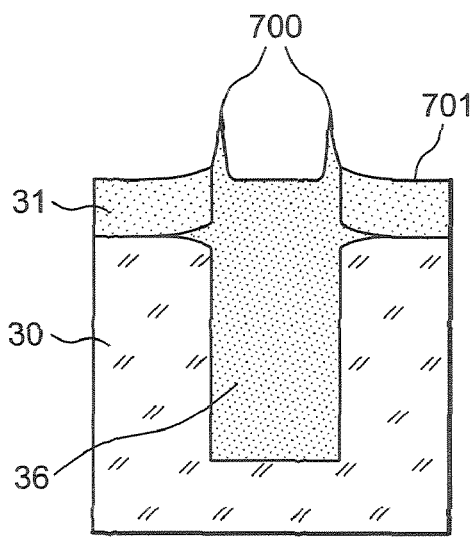
Figure 15D:
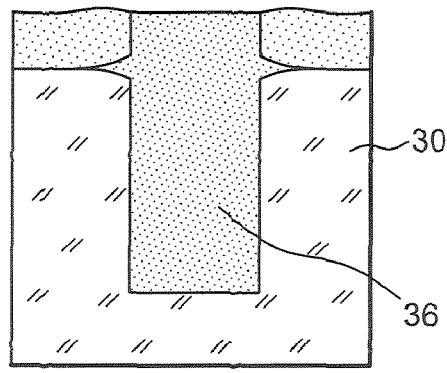
Figure 15E:
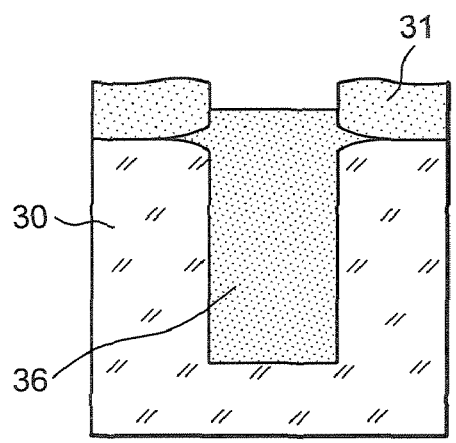

An alternative of this example may be achieved in order to obtain areas of thicker insulators in the silicon wafer. The nitride film is deposited by LPCVD, for example. The thickness of the nitride film is adapted according to the reduction in thickness which it will undergo during the subsequent heat oxidation (as explained above in connection with FIG. 12A). For example, it will have an initial thickness of 180 nm. In this alternative, the etched patterns have a silicon etching depth of 1.5 μm (FIG. 15A, 15B).

Thermal oxidation is used at 1,100° C. for example to generate about 3 μm of oxide in a moist atmosphere (standard steam type methods in microelectronics). In this case, the thickness of the nitride film is reduced by oxidation by about 110 nm. After a step for removing the generated oxide, during this oxidation, only about 70 nm of nitride is left at the surface of the nitride film.

In such a case, at the edge of the patterns, (FIG. 15C) oxide overlapping areas 700 appear, consisting in a local overthickness of oxide relatively to the upper level 701 of the mask 31 (for example a nitride mask). These overlapping areas represent a very low surface density of the face being structured. By using a planarization method, according to a known technique elsewhere (see for example, the chapter on planarization of oxides in the book Chemical Mechanical Planarization of Microelectronic Materials, J. Steigerwald et al., John Wiley & Sons, New York, 1997), these overlapping areas (FIG. 15D) may be eliminated.

Figure 15F:
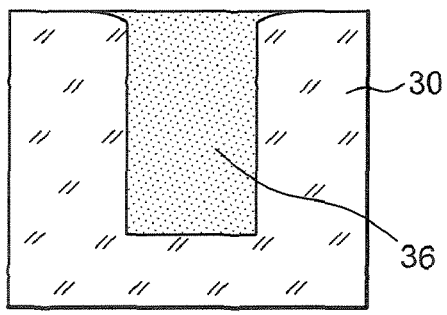
Figure 16A:
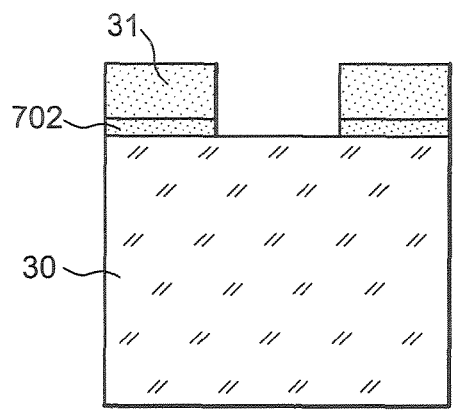
Figure 16B:
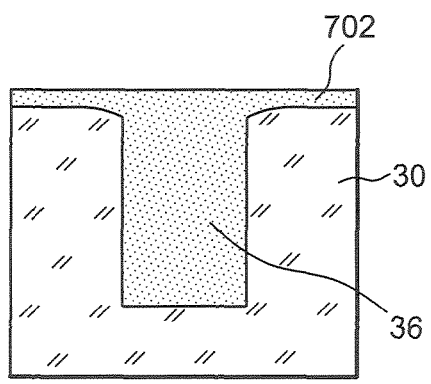

The insulator height (here $SiO_2$) i.e., the upper level of the oxide of the patterns in order to bring it to the lower level of the nitride, is lowered by chemical etching, while leaving, relatively to this same level, a slight overthickness of oxide (FIG. 15E) which will be removed during the removal of the nitride mask 31 (FIG. 15F). The upper surface of the oxide 36 then reaches the level of the lower surface of the mask 31 during or after removal of the latter.

The following steps are identical with those of the previous example starting from the removal of the nitride mask.

According to a further alternative (FIG. 16A), a fine oxide layer 702 is introduced under the nitride film 31 used as a mask. This oxide film may be made by initial thermal oxidation of the silicon wafer 30, and may for example have a thickness of 20 nm. The oxide film is for example etched just after the etching of the nitride film 31 so that the patterns in the silicon 30 may subsequently be etched with a depth of 1.5 μm, for example. With such an alternative method, it is possible to obtain in fine, after steps similar to those described above in connection with FIGS. 15B-15E, a structured wafer having (FIG. 16B) an alternation of areas covered with a fine oxide film 702 (~20 nm in this alternative) and of areas 36 covered with a thicker oxide (~3 μm in this example). Here again, the upper surface of the oxide 36 then reaches the level of the lower surface of the mask 31, during or after removal of the latter.

Second Example

This second example is an alternative of the first example.

The structured wafer is bonded onto a second non-oxidized silicon wafer 50 (FIG. 6F). Because of the cleaning procedure, a native oxide film is present on the exposed silicon areas 40, 48 of the structured wafer and on the second silicon wafer.

With heat treatments at high temperature, for example greater than 1,100° C. for two hours, this oxide may be caused to disappear locally. In this way, a PSOI type stacked structure is obtained. With the view to facilitate the disappearance of the possible interface oxide, one will try as much as possible to minimize the crystallographic misalignment between both bonded silicon wafers.

Third Example

In this third example, a first silicon wafer 30 is thermally oxidized at 900° C. under a dry oxygen atmosphere, in order to generate an oxide film 33 with a thickness of 20 nm (FIG. 8A). A nitride film 32 is deposited on the latter by PECVD, with a thickness of 80 nm. The patterns 34 are etched in the silicon with a RIE type (reactive ion etching) method and have a depth of 50 nm in the silicon (FIG. 8C).

The thermal oxide 36 is obtained in these patterns by a heat treatment at 900° C. under a steam atmosphere. Its thickness is 140 nm. The surface 37 of the generated oxide 36 in the etched patterns is at the level of the nitride-initially deposited silicon oxide interface 41 (FIG. 8D).

The thereby structured wafer is submitted to chemical etching by orthophosphoric acid at 140° C. The areas covered with nitride are etched.

The surface of the structured wafer then consists of thermal oxide (FIG. 8C). It is planar, smooth, compatible with subsequent molecular bonding. The wafer is then cleaned in order to suppress possible hydrocarbons, to remove the particles, to make the surface hydrophilic.

This first structured wafer 50 is then bonded on a second cleaned non-oxidized silicon wafer according to the same procedure (FIG. 8F). The stacked structure is submitted to heat treatment, for example at 1,100° C., for 2 hrs under an argon atmosphere. The second silicon wafer of this stacked structure is then thinned by a grinding technique so as to leave only 20 micrometers of silicon 52, for example. In this way an MSOI type stacked structure is obtained.

The alternative of the first example described above in connection with FIGS. 16A and 16B is also an alternative of this third example.

Fourth Example

This fourth example is an alternative of the third example.

The thickness of the initial oxide film 33 is 10 nanometers (FIG. 8A). The thickness of the nitride film and the depth of the etched patterns in the silicon are identical with the previous example.

The oxide 36 generated in the patterns 34 has a thickness of 120 nanometers. The end of the preparation of this first structured wafer is identical with Example 3. This first wafer is then bonded onto a second oxidized silicon wafer, the thickness of the oxide of this second wafer being 10 nanometers, achieved by thermal oxidation at 900° C. under dry oxygen, this second wafer being cleaned according to the same procedure.

The stacked structure is submitted to a heat treatment, for example at 1,100° C. for 2 hrs, under an argon atmosphere.

The second silicon wafer of this stacked structure is then thinned by a grinding technique so as to leave only 5 micrometers of silicon 52, for example. In this way, an MSOI type stacked structure (FIG. 8F) is obtained.

Fifth Example

In this fifth example, an alternative of the fourth example, the second wafer is implanted with hydrogen ions, for example at an energy of 70 keV and with doses of $5.10^{16}$ at/cm$^2$, before being cleaned and bonded onto the first structured wafer.

A fracture is induced in this second wafer when the stacked structure is for example submitted to heat treatment at 500° C. for 30 minutes.

A silicon film 52 with a thickness close to 0.5 micrometer is obtained, made integral by molecular bonding with the first structured wafer. The stacked structure is then submitted to a heat treatment at high temperature, for example greater than 1,000° C., so as to consolidate the molecular bonding. In this way an MSOI type stacked structure with a fine superficial silicon film is obtained.

Sixth Example

This sixth example is an alternative of the third, the fourth or the fifth example. A 20 nanometer oxide film 33 is initially produced on a first wafer (FIG. 8A). A 80 nanometer thick nitride film 32 is produced by PECVD on this oxide.

Patterns 34 are etched on this first wafer with a depth of 50 nanometers in the silicon.

By a thermal oxidation treatment under a steam atmosphere, a 160 nanometer thick oxide 36 may be produced in the etched patterns.

The surface 37 of the oxide produced in the patterns is higher (by about 20 nanometers) than the initial oxide-nitride interface 41.

With selective etching, it is possible to reduce the oxide thickness 36 in the patterns without reducing the nitride thickness. This etching consists in etching with 1% diluted hydrochloric acid. The oxide etching rate is of the order of 6 nanometers per minute. In particular, by using techniques for optical measurement of the thicknesses of the film, such as for example ellipsometry, with this step, the surface of the oxide 36 produced in the patterns and the nitride/initial oxide interface 41 may be aligned accurately. A planar and smooth surface is then obtained, compatible with subsequent molecular bonding.

Seventh Example

In this seventh example, an alternative of the first or second example, a 80 nanometer thick nitride film is produced by PECVD on a first silicon wafer (FIG. 6A). Patterns 34 are etched on this first wafer with a depth of 50 nanometers in the silicon. With a thermal oxidation treatment under a steam atmosphere, it is possible to produce a 120 nanometer thick oxide 36 in the etched patterns (FIG. 6D).

The surface 39 of the oxide produced in the patterns is higher (by about 20 nanometers) than the silicon/nitride interface 35. With selective etching, it is possible to reduce the oxide thickness in the patterns without reducing the nitride thickness. This etching consists in etching with 1% diluted hydrochloric acid. The oxide etching rate is of the order of 6 nanometers per minute. In particular, by using optical techniques for measuring thicknesses of films, such as ellipsometry for example, this step enables the surface 37 of the produced oxide in the patterns and the nitride/initial oxide interface 35 to be aligned accurately. A planar and smooth surface is then obtained, compatible with subsequent molecular bonding.

Eighth Example

One starts with a silicon wafer 30 (FIG. 17A) on which a 50 nanometer thick nitride film 31 is deposited.

A resin film, for example a positive film, is laid thereon and then insolated through a first mask, development is carried out and a mask is thereby formed with the non-insolated resin.

By etching (e.g. RIE), this resin mask is transferred into the nitride film. The remaining resin is removed.

By means of the nitride mask 31, the silicon 30 is etched, for example up to a depth of 1.5 μm, by dry etching (e.g. RIE) or by wet etching (e.g. TMAH) in order to form patterns 34.

An insolating film 703 (FIG. 17B), for example of silica, is then deposited with a thickness of 1.6 μm and for example by a PECVD deposition technique or by an LPCVD deposition technique.

Next, one proceeds with removing the silica film at the base of the nitride areas 31 by using a lithographic technique based on a counter-mask principle, according to a technique known elsewhere (see for example the book mentioned above, the chapter on <<Shallow Trench Isolation>>, page 274). Conventionally, after oxide deposition, a resin, for example a positive resin, is laid on the oxide, and insolation is produced through a mask. This mask is said to be a counter-mask because it is complementary to the first mask used initially and it allows a non-insolated overlapping area 700 to be defined around patterns 34 produced initially.

Figure 17A:
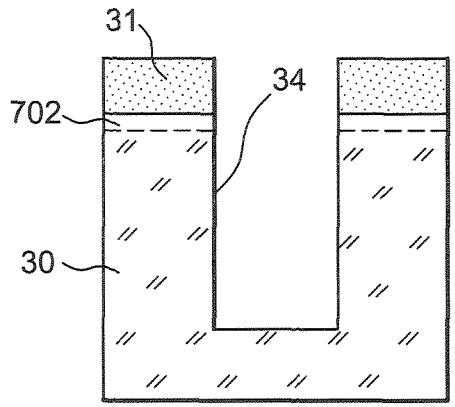
Figure 17B:
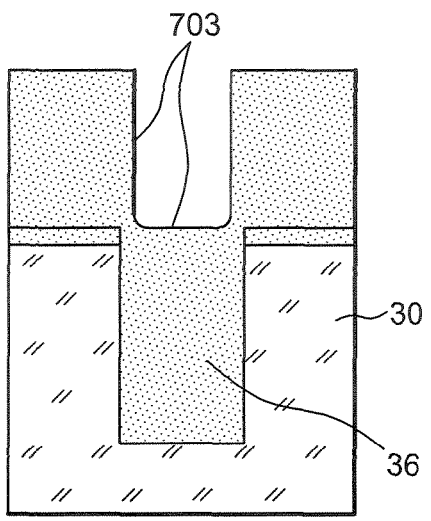
Figure 17C:
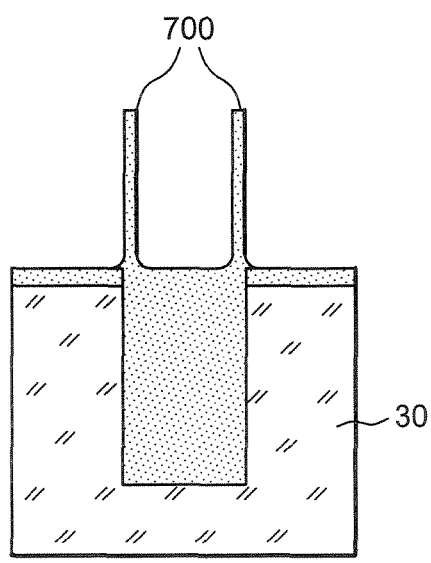

After development of the resin, there remains a resin mask at the base of the patterns. With for example dry (RIE) etching, it is possible to suppress, by means of this resin mask, the oxide at the base of the areas covered with nitride, except in the overlapping areas 700 (FIG. 17C).

The oxide overlapping areas consist in a local overthickness of the deposited oxide relatively to the upper level of the mask 31 (a nitride mask in this example).

Figure 17D:
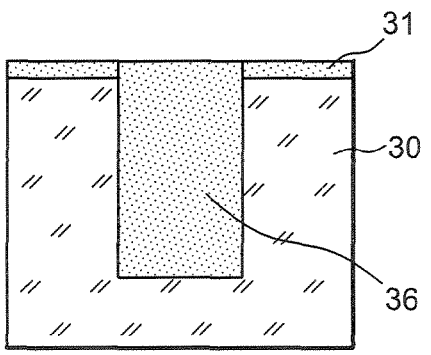
Figure 17E:
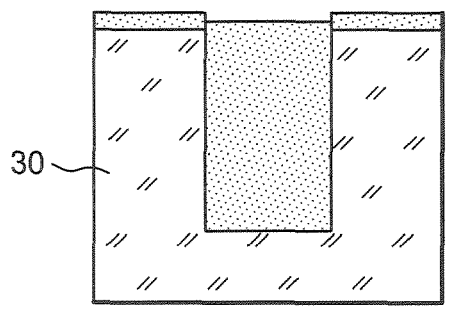

The overlapping areas represent a very low surface density of the face being structured. These overlapping areas may be removed by using a planarization method, according to a technique known elsewhere (e.g., see the chapter on oxide planarization in the book above). The upper level of the silica film 36 in the patterns is then in the vicinity of the upper level of the nitride film 31 (FIG. 17D).

By chemical etching, the upper level of the oxide of the patterns is lowered in order to bring it to the lower level of the nitride 31 while leaving a slight oxide overthickness which will be removed during removal of the nitride (FIG. 17E) For example, if the nitride film has a thickness of 50 nm, this will leave an oxide overthickness of 5 nm. Also for example, the nitride 31 is removed by chemical etching in $H_3PO_4$ at 160° C.

Figure 17F:
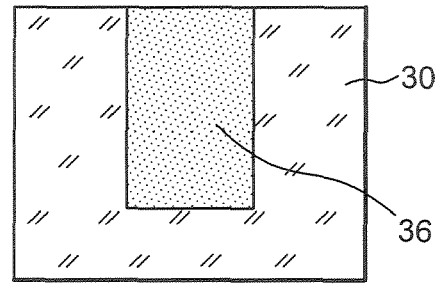
Figure 17G:
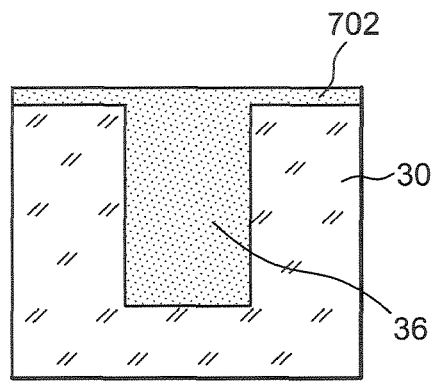

After removal of the nitride, the upper level of the oxide 36 of the patterns 34 is at the upper level of the silicon areas which were underlying the nitride mask (FIG. 17F). The upper surface of the oxide 36 then reaches the level of the lower surface of the mask 31, during or after removal of the latter.

A surface preparation (chemical cleaning, surface activation by CMP or by plasma . . . ) may be used for making the surface suitable for subsequent bonding. Such a structured wafer may then be bonded onto another wafer, for example of silicon or oxidized silicon.

According to an alternative of this exemplary embodiment, a fine oxide layer 702 (FIG. 17A) is introduced under the nitride film 31 used as a mask.

This oxide film may be produced by initial thermal oxidation of the silicon wafer and may have a thickness of 20 nm for example.

For example the oxide film is etched just after etching the nitride film so that the patterns may be subsequently etched in the silicon.

With such an alternative method, it is possible to obtain in fine, after steps similar to those described above in connection with FIGS. 17B-17E, a structured wafer (FIG. 17G) having an alternation of areas covered with a fine oxide film 702 (~20 nm in this example) and areas covered with a thicker oxide 36 (~1.5 μm in this example).

Ninth Example

A nitride film with a thickness of about 120 nm is deposited on a silicon wafer, for example by LPCVD.

A film of resin for example a positive resin, is laid thereon and is then insulated through a mask, development is carried out and a mask 31 with the non-insulated resin (FIG. 18A) is thereby formed on the silicon substrate 30.

This resin mask is transferred into the nitride film by dry etching (e.g. RIE). The remaining resin is removed.

By means of the nitride mask, the silicon is etched for example up to a depth of 1.5 µm, either by dry etching (e.g. RIE) or by wet etching (e.g. TMAH) in order to form patterns 34 (FIG. 18A), for example.

A first 2.5 µm thick silica film 704 is then deposited (FIG. 18B) by PECVD or by LPCVD.

This silica film is removed at the base of the nitride areas 31 by using these nitride areas as pads for stopping planarization, with which it is possible to retain good removal homogeneity by a planarization method, according to a technique known elsewhere (see the chapter on oxide planarization in the book already mentioned above).

Figure 18A:
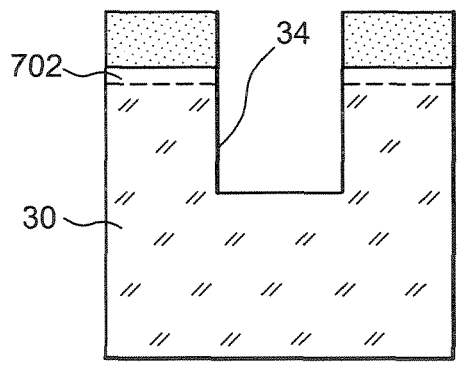
Figure 18B:
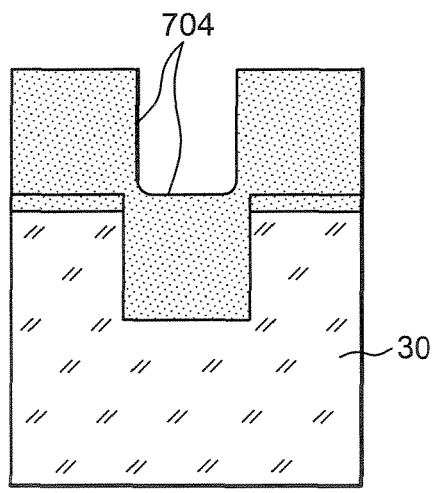
Figure 18C:
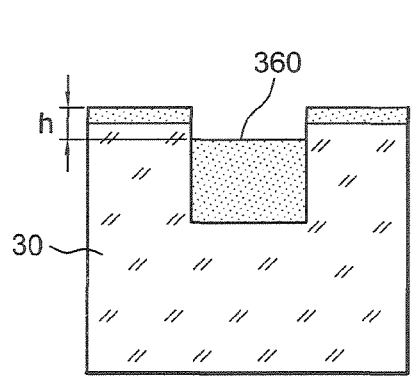
Figure 18D:
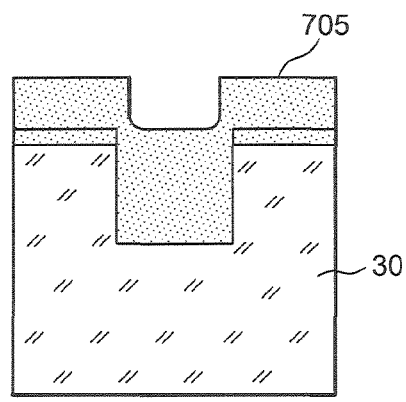

It is seen, after the first planarization step that the upper level 360 of the oxide in the patterns 34 is then depressed relatively to the upper level of the nitride mask 31 by a height h of the order of 80 nm (FIG. 18C).

A second silica film 705 with a thickness of about 0.25 µm (FIG. 18D) is then deposited by PECVD or LPCVD for example.

If need be, such a step may be carried out once or several times and with depositions of more or less thick oxide films for each deposition/planarization cycle by using these nitride areas as pads for stopping planarization.

The silica film is removed at the base of the nitride areas 31 by using these nitride areas as pads for stopping planarization. For example a planarization method of the same type as earlier is used.

Figure 18E:
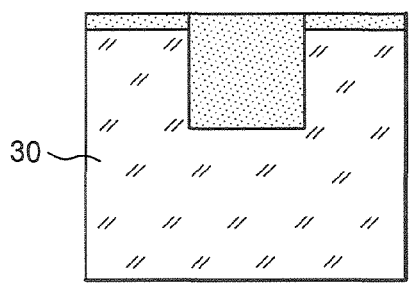
Figure 18F:
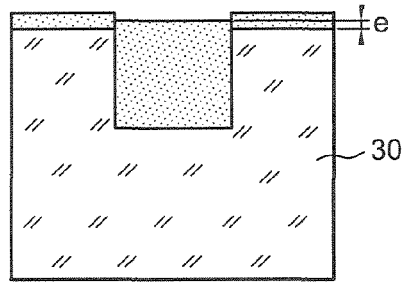

The upper level of the silica film in the patterns is then in the vicinity of the upper level of the nitride film (FIG. 18E).

By chemical etching, the upper level of the oxide of the patterns is lowered in order to bring it to the lower level of the nitride by leaving a slight overthickness of oxide (FIG. 18F) which will be removed during removal of the nitride mask. For example, if the nitride film has a thickness of 50 nm, this will leave an oxide overthickness e of 8 nm. Also for example, the nitride may be removed by chemical etching in $H_3PO_4$.

Figure 18G:
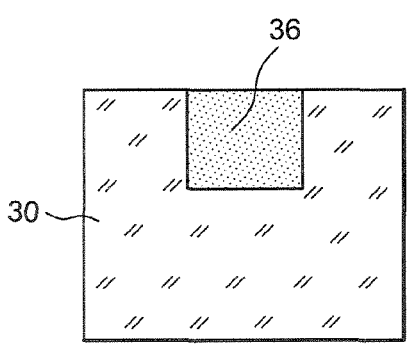
Figure 18H:
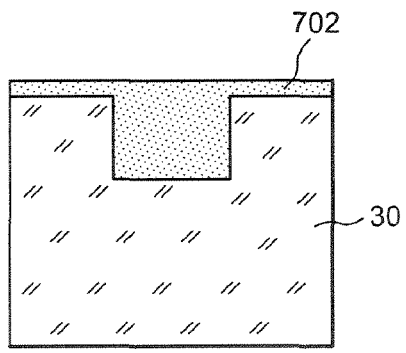

After removal of the nitride, the upper level of the oxide 36 of the patterns 34 is at the upper level of the silicon areas, which were underlined the nitride film 31 (FIG. 18G). The upper surface of the oxide 36 therefore reaches the level of the lower surface of the mask 31, during or after removal of the latter.

A surface preparation (chemical cleaning, surface activation by CMP or by plasma ...) may be used in order to make the surface suitable for subsequent bonding. Such a structured wafer may then be bonded onto another wafer, for example a silicon wafer, either oxidized or not at the surface, depending on whether the application relates to PSOI or MSOI structures.

According to an alternative of this exemplary embodiment, a fine oxide film 702 is introduced under the nitride film 31 used as a mask (FIG. 18A).

This oxide film 702 may be produced by initial thermal oxidation of the silicon wafer and may have a thickness of 20 nm for example.

The oxide film is for example etched just after etching the nitride film so that the patterns may be subsequently etched in the silicon.

With such an alternative method, it is possible to obtain in fine after steps similar to the one described above in connection with FIGS. 18A-18F, a structured wafer (FIG. 18H) having an alternation of areas covered with a fine oxide film 702 (~20 nm in this example) and of areas 36 covered with a thicker oxide (~1.5 µm in this example).

The invention claimed is:

1. A method for producing a semiconducting structure, comprising:
   controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material, and
   removal of the mask after said formation,
   the insulator formation step including:
   a1) a substep for controlled growth of an insulating material, up to above the level of the lower surface of the mask, and
   a2) a substep for selectively thinning the insulating material, in order to bring it back to the level of the lower surface of the mask.

2. The method according to claim 1, the formation of insulating material including a step for controlled growth of said insulating material up to the level of the lower surface of the mask.

3. The method according to claim 1, the step a2 being performed by chemical etching.

4. The method according to claim 1, the substep a1) being a step for controlled growth of an insulating material above the upper surface of the mask.

5. The method according to claim 1, the substrate further including a conducting layer at the surface.

6. The method according to claim 1, the removal of the mask being performed selectively relatively to the insulating material.

7. The method according to claim 1, the insulating material being selected from the group consisting of $SiO_2$, $Al_2O_3$, AlN, SiON, $Si_3N_4$, diamond, $HfO_2$, and a dielectric material with a high dielectric constant.

8. The method according to claim 1, the mask being in nitride $Si_3N_4$, or $Al_2O_3$ or AlN.

9. The method according to claim 1, the material of the first substrate including areas with different dopings.

10. The method according to claim 1, the formation of insulator through the mask at least partly including thermal oxidation of the semiconducting substrate.

11. A method for producing a semiconducting structure including the formation:
   a) of a first insulating area in a semiconducting substrate, and
   b) then the formation of at least a second insulating area in the same substrate, the steps a) and b) being carried out according to claim 1.

12. The method according to claim 1, an insulating film being produced on at least one of the two substrates.

13. The method according to claim 1, wherein the formation of insulating material includes thermal growth of the insulating material in the semiconductor substrate.

14. The method according to claim 1, wherein the formation of insulation material includes deposition of said insulating material.

15. The method according to claim 4, the removal of at least one portion of the insulating material at the base of the mask leaving at least one overlapping area.

16. The method according to claim 4, the removal of at least one portion of the insulating material at the base of the mask being uniform, at least one portion of the mask being used as stopping areas during this removal.

17. The method according to claim 4, the substep a1) including a substep for growing overlapping areas above the upper surface of the mask.

18. The method according to claim 15, further including removal of the overlapping areas.

19. The method according to claim 5, the conducting layer being in suicide or in metal or in doped Si.

20. The method according to claim 5, the conducting layer being covered with a protective layer.

21. The method according to claim 20, the protective layer not being removed after removal of the mask.

22. The method according to claim 10, further including deposition of insulator or oxide.

23. The method according to claim 11, the steps a) and b) being carried out with different masks.

24. The method according to claim 11, at least two of the formed insulating areas having different depths and/or widths in the substrate and/or being formed with different insulating materials.

25. A method for producing a semiconducting structure, comprising:
  controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material, and
  removal of the mask after said formation,
  wherein the insulator formation includes:
  a1) a substep for controlled growth of an insulating material, up to above the level of the lower surface of the mask, and
  a2) a substep for selectively thinning the insulating material, in order to bring it back to a level higher than the lower surface of the mask, thereby maintaining a residual insulator layer above this surface.

26. The method according to claim 25, the residual layer being at least partly removed during removal of the mask.

27. The method according to claim 25, the residual layer being at least partly removed during removal of a superficial layer formed on the mask during the substep a1).

28. A method for producing a semiconducting structure, comprising:
  controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material, and
  removal of the mask after said formation,
  wherein the substrate further includes an insulating layer at the surface.

29. The method according to claim 28, further including a step for suppressing the insulator layer in order to form an alternation of semiconducting areas and of insulating areas.

30. The method according to claim 28, the insulating layer having a thickness between 1 nm and 0.5 μm.

31. A method for producing a semiconducting structure, comprising:
  controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material,
  removal of the mask after said formation,
  wherein the controlled formation comprises,
  etching of the first substrate in the semiconducting material, through the mask before removal of the mask, to form at least one etched area in the semiconducting material, and to form the at least one etched area optionally in an insulating surface layer on the first substrate or optionally in a conducting layer on the first substrate and optionally in a protective layer on the conducting layer on the first substrate, and
  forming the insulating material in at least the at least one etched area.

32. The method according to claim 31, the etched area having a depth in the first semiconducting material between 1 nm and 10 μm.

33. A method for producing a semiconducting structure, comprising:
  controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material, and
  removal of the mask after said formation,
  wherein the semiconducting material is silicon or $Si_{1-x}Ge_x$ ($0 \leq x \leq 1$).

34. A method for producing a semiconducting structure, comprising:
  controlled formation, through a mask, in a first substrate in a semiconducting material, of at least one first area in an insulating material, up to the level of the lower surface of the mask, before removal of the mask, so that after removal of the mask the upper level of this first area is at the level of the lower surface of the mask, wherein the formation of insulating material at least partly includes thermal growth of said insulating material in the semiconducting substrate and/or deposition of said insulating material,
  removal of the mask after said formation, and
  further including an assembly step with a second substrate.

35. The method according to claim 34, the assembly being achieved by molecular adhesion.

36. The method according to claim 34, the second substrate being in a second semiconducting material.

37. The method according to claim 34, further including a step for thinning the first and/or the second substrate.

38. The method according to claim 34, the first and/or second substrate including at least one first conductivity area and a second conductivity area at the surface.

39. The method according to claim 36, the second substrate further including an insulator layer on the second semiconducting material.

40. The method according to claim 36, the first substrate having at least one area of a first conductivity type, and the second substrate having at least one area of opposite conductivity type.

41. The method according to claim 36, the second substrate including at least one surface circuit or component portion.

42. The method according to claim 37, the step for thinning either one or both of the substrates being performed by forming an embrittlement layer or area.

43. The method according to claim 42, the embrittlement layer or area being produced by a porous silicon layer.

44. The method according to claim 43, the formation of an embrittlement layer or area being achieved by implanting ions in the first or second substrate.

45. The method according to claim 44, the implanted ions being hydrogen ions, or a mixture of hydrogen ions and helium ions.

46. The method according to claim 45, the thinning step being obtained by polishing or etching.

47. A method for producing a semiconducting component, including:
   formation or controlled growth of an insulator through a mask, in a first area of a semiconducting substrate, and up to above the level of the lower surface of a mask covering at least a second area of the substrate, or covering an insulating layer or a conducting layer or a protective layer of a conducting layer covering at least a second area of the substrate, and
   etching of the insulator, selectively relatively to the mask, and etching of the mask, selectively relatively to the insulator, in order to bring the other surface of the insulator back to the level defined by the lower surface of the mask.

48. The method according to claim 47, etching of the insulator leaving a residual insulator layer above the level defined by the lower surface of the mask.

49. The method according to claim 47, including etching of the first area of the substrate.

50. The method according to claim 47, the semiconducting material being silicon or $Si_{1-x}Ge_x(0 \leqq x \leqq 1)$.

51. The method according to claim 47, the insulating material being selected from the group consisting of $SiO_2$, $Al_2O_3$, AlN, SiON, $Si_3N_4$, diamond, $HfO_2$, and a dielectric material with a high dielectric constant.

52. The method according to claim 47, the mask being in nitride $Si_3N_4$, or $Al_2O_3$ or AlN.

53. The method according to claim 47, further including an assembly step with a second substrate.

54. The method according to claim 47, the material of the first substrate including areas with different dopings.

55. The method according to claim 47 the formation of insulator through the mask at least partly including thermal oxidation of the semiconducting substrate.

56. The method according to claim 47, an insulating film being produced on at least one of the two substrates.

57. The method according to claim 48, the residual layer being at least partly removed during etching of a superficial layer covering the mask and/or at least partly removed during the etching of the mask.

58. The method according to claim 49, the etched area having a depth in the substrate between 1 nm and 10 µm.

59. The method according to claim 53, the assembly being achieved by molecular adhesion.

60. The method according to claim 53, the second substrate being in a second semiconducting material.

61. The method according to claim 53, further including a step for thinning the first and/or the second substrate.

62. The method according to claim 53, the first and/or second substrate including at least one first conductivity area and a second conductivity area at the surface.

63. The method according to claim 60, the second substrate further including an insulator layer on the second semiconducting material.

64. The method according to claim 60, the first substrate having at least one area of a first conductivity type, and the second substrate having at least one area of opposite conductivity type.

65. The method according to claim 60, the second substrate including at least one surface circuit or component portion.

66. The method according to claim 61, the step for thinning either one or both of the substrates being performed by forming an embrittlement layer or area.

67. The method according to claim 66, the embrittlement layer or area being produced by a porous silicon layer.

68. The method according to claim 67, the formation of an embrittlement layer or area being achieved by implanting ions in the first or second substrate.

69. The method according to claim 68, the implanted ions being hydrogen ions, or a mixture of hydrogen ions and helium ions.

70. The method according to claim 69, the thinning step being obtained by polishing or etching.

71. The method according to claim 55, further including deposition of insulator or oxide.

72. A method for producing a semiconducting structure including the formation:
   a) of a first insulating area in a semiconducting substrate, and
   b) then the formation of at least a second insulating area in the same substrate, the steps a) and b) being carried out according to claim 47.

73. The method according to claim 72, the steps a) and b) being carried out with different masks.

74. The method according to claim 72, at least two of the formed insulating areas having different depths and/or widths in the substrate and/or being formed with different insulating materials.

* * * * *